(12) United States Patent
Jaroszewski et al.

(10) Patent No.: US 8,145,341 B2
(45) Date of Patent: Mar. 27, 2012

(54) PRODUCT BASED CONFIGURATION AND CONTROL OF MANUFACTURING EQUIPMENT

(76) Inventors: Brian B. Jaroszewski, Austin, TX (US); Hardy Cross Dillard, San Francisco, CA (US)

( * ) Notice: Subject to any disclaimer, the term of this patent is extended or adjusted under 35 U.S.C. 154(b) by 1159 days.

(21) Appl. No.: 11/679,798

(22) Filed: Feb. 27, 2007

(65) Prior Publication Data
US 2007/0204086 A1    Aug. 30, 2007

Related U.S. Application Data

(60) Provisional application No. 60/777,425, filed on Feb. 27, 2006.

(51) Int. Cl.
*G06F 19/00* (2006.01)
(52) U.S. Cl. ............... 700/121; 438/129; 29/740
(58) Field of Classification Search ............ 700/121; 438/129; 29/740, 832
See application file for complete search history.

(56) References Cited

U.S. PATENT DOCUMENTS

| | | | |
|---|---|---|---|
| 3,961,228 A * | 6/1976 | Briggs et al. | 361/803 |
| 5,977,488 A * | 11/1999 | Jeon | 174/250 |
| 6,078,700 A * | 6/2000 | Sarachik | 382/291 |
| 6,357,108 B1 * | 3/2002 | Carr | 29/711 |
| 6,798,925 B1 * | 9/2004 | Wagman | 382/287 |
| 7,231,857 B2 * | 6/2007 | Hill et al. | 83/100 |
| 7,475,472 B2 * | 1/2009 | Haarberg et al. | 29/739 |
| 7,621,190 B2 * | 11/2009 | Ahmad et al. | 73/862.474 |
| 2004/0143352 A1 * | 7/2004 | Gyorfi et al. | 700/99 |

OTHER PUBLICATIONS

Vetorazzi et al.; "Robot Program Generatin for PCB(Printed Circiuit Board) Component Insertion via CAD System"; May 27, 1994;; Industrial Electronics 1994, Symposium Proceedings, ISIE '94, 1994 IEEE Internaltion YSmposium pp. 339-344.*

* cited by examiner

*Primary Examiner* — Albert Decady
*Assistant Examiner* — Chad Rapp
(74) *Attorney, Agent, or Firm* — Fish & Richardson P.C.

(57) ABSTRACT

Methods and apparatus, including computer program products, for product based configuration and control of manufacturing equipment. The present invention provides a method for manufacturing. The method includes identifying components to be mounted on a printed circuit board of a product and generating information that specifies the components. The method includes determining, for each of the identified components, the location on the printed circuit board where the component is to be mounted and generating coordinates that indicate the location. The coordinates are of a coordinate system having a frame of reference that is independent from any master printed circuit board. The method includes associating the generated information with the product.

45 Claims, 20 Drawing Sheets

PRODUCT BASED CONFIGURATION AND CONTROL OF MANUFACTURING EQUIPMENT

CROSS-REFERENCE TO RELATED APPLICATIONS

This application is a non-provisional application and claims the benefit of priority under 35 U.S.C. Section 119 of U.S. Provisional Application Ser. No. 60/777,425, filed on Feb. 27, 2006. The disclosure of this prior application is considered part of and is herein incorporated by reference in its entirety in the disclosure of this application.

BACKGROUND

The present invention relates to manufacturing and component placement machines.

A printed circuit board ("PCB" or "printed wiring board") has a base of one or more layers of insulating material, for example, a non-conductive substrate, bearing a pattern of conductive material. Electrical circuits can be formed when electronic components are added to a PCB. Electronic components can be embedded inside a PCB during fabrication and/or mounted (e.g. attached and soldered) on a PCB during assembly. Components can be mounted on one or both sides of a PCB. Products that include PCBs can be, by way of example, a mobile phone, a personal digital assistant, a pager, and a computer.

A manufacturing system, particularly one used to manufacture products that include a PCB, typically includes one or more component placement machines. In general, component placement machines are used to place electronic components, for example, integrated circuits, onto a PCB. A component placement machine typically includes one or more devices, or feeders, that convey the electronic components to the component placement machine. Examples of feeders include but are not limited to bulk feeders, stick feeders, tape feeders, and tray-stack feeders. A component placement machine also typically includes one or more devices, or placement mechanisms, that move electronic components from the feeders to the appropriate location on the PCB. Examples of placement mechanisms include but are not limited to vacuum nozzles and mechanical grippers. Each placement head can have one or more placement mechanisms for picking up components from feeders and placing these components on a PCB. A gantry in a component placement machine can have one or more placement heads. A component placement machine can mount components in parallel by application of a number of parallel operating placement heads. Examples of component placement machines include but are not limited to pick-and-place machines, collect-and-place machines, and chip shooters.

A master PCB entering a component placement machine may include multiple panels, each of which panel can be subsequently further processed and separated from the master PCB during a depaneling process. Each panel, or product PCB, may contain some or all of the electronic components used in an individual product. An individual PCB in a mobile phone, by way of example, is a product PCB. Master PCBs contain multiple product PCBs. In manufacturing, electronic components are typically placed onto a master PCB.

A PCB, whether it is a master PCB or a product PCB, typically has a layout, which is a spatial arrangement of, for example, traces (conductive materials), vias and/or insulating materials forming the board. The layout also can include the spatial arrangement of other components, elements, materials and parts. A PCB also has a placement layout, which is a spatial arrangement of locations on the printed circuit board where electronic components are to be placed and a mounting configuration of each location. The placement layout of a PCB is, in a sense, a spatial arrangement of the footprints of each component that will populate the PCB. The placement layout of a PCB is determined, at least in part, by the layout of the PCB. Placing an electronic component on a PCB generally refers to the positioning of the component at the appropriate location on the PCB and includes, for example, using a gripper to mount the component at the location or using, for example, a shooter mechanism to propel the component to the location. Each component placement location on the PCB typically accommodates one or more types of electronic component. The particular combination of the types of electronic components to be placed at each location, i.e., the component configuration, is generally dictated by the product for which the PCB is being manufactured. A product PCB, thus, typically has a component configuration. Note that components can be stacked, i.e., placed on top of one another.

A component placement machine typically operates under the control of a computer, which can provide control in accordance with information included in a production file. A production file generally includes all the information needed for controlling a particular component placement machine in a process that places one or more of the components loaded in its feeders onto a PCB.

SUMMARY

The present invention provides methods and apparatus, including computer program products, that implement techniques for product based configuration of a manufacturing system including one or more component placement machines.

The invention can be implemented to realize one or more of the following advantages. Methods and apparatus described in the present specification allow a manufacturing system to store and use information at a product level of specificity. Storing information at such a level of specificity improves the flexibility of the manufacturing system in many respects. Given a particular combination of product PCBs, for example, the manufacturing system can design a master PCB that contains a particular combination of product PCBs. Furthermore, component placement machines of the manufacturing system can be configured to improve efficiency. The designing of the master PCB and the configuring of the component placement machines can be implemented in real time and without requiring manual input. Thus, it is possible to reduce resources needed to manually design a master PCB, to configure a manufacturing system including one or more component placement machines, and to control a manufacturing system including one or more component placement machines while producing products in response to a customer order. Furthermore, the system can save resources, for example, computing, labor, and material resources, by storing information at the product level of specificity and then combining the stored information as needed to fulfill customer orders. The built-to-order implementation described below may allow a manufacturer to maintain a lower level of assembled product inventory. One implementation of the invention provides all of the above advantages.

Details of one or more implementations of the invention are set forth in the accompanying drawings and in the descrip-

BRIEF DESCRIPTION OF THE DRAWINGS

Like reference numbers and designations in the various drawings indicate like elements.

DETAILED DESCRIPTION

Overview

Figure 1:
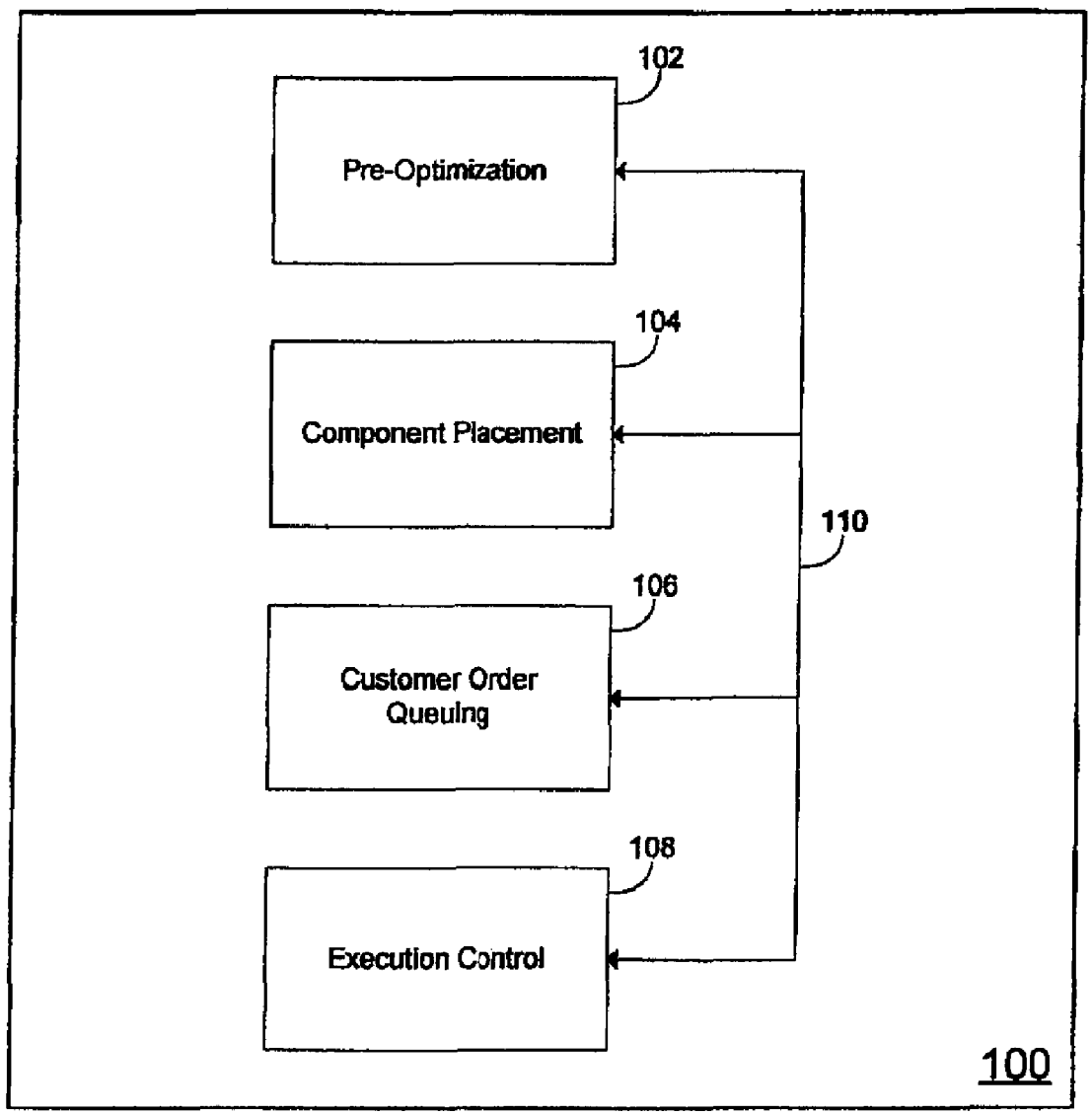
FIG. 1 shows a block diagram of an execution control system.

A manufacturing system in accordance with the invention stores and use information at the product level of specificity. The manufacturing system, for example, can associate with a particular product, all information needed to assemble a product PCB. The information needed to assemble the product PCB includes information specifying electronic components (e.g., integrated circuits) to be placed on the product PCB. Also included are coordinates that indicate, for each of the electronic components specified, the location on the printed circuit board where the electronic component is to be placed and the mounting configuration of each location. The information can be stored in a product file (which is different than a production file as will be described below). The coordinates stored in the product file are of a coordinate system that has a frame of reference independent of any master printed circuit board. That is, no reference to a master PCB is needed in the product file to determine the location on the product PCB where the electronic component is to be mounted. In one implementation, information needed to assemble a product PCB is extracted from one or more CAD files (having, for example, information describing the layout and the component configuration of a master PCB) and then stored in a product file. The information in the product file can incorporate the necessary information required for assembling electronic components on both sides of the PCB. The manufacturing system can and typically includes multiple product files, each including information for assembling a different product PCB.

The manufacturing system can associate with a particular product, all information needed to fabricate a product PCB. The coordinate information needed to fabricate a product PCB includes, but is not limited to, coordinates that specifies the location of apertures and coordinates that specify location of drill holes. The coordinates stored in the product file are of a coordinate system that has a frame of reference independent of any master PCB. The information required for fabricating each layer of the PCB. A fabricated product PCB may contain embedded electronic components, for example, embedded passive components.

The manufacturing system can use the above described product specific information, e.g., information in the product files, to perform various manufacturing functions. For example, the manufacturing system can use product specific information to configure its component placement machines and to determine the placement mechanisms to be used to populate the electronic components in the component placement machine. Configuring component placement machines includes allocating feeders, i.e., determining which electronic components to load into which feeder of the machines. Configuring also includes allocating placement tasks, i.e., determining which component placement machine places which electronic component.

The manufacturing system can further use the product specific information to automatically design master PCBs in real time. The manufacturing system can use the product specific information to automatically design workload files in real time. (Workload files are described below.) The manufacturing system can include one or more applications that perform these and other manufacturing functions. The manufacturing system's software and functions are further described below.

To track product PCBs, the manufacturing system can implement a unique identification ("UID") for each product PCB. The manufacturing system can use any well known UID system including, for example, radio frequency identification, bar codes, identification numbers stored in a memory component placed on the product PCB, and identification numbers implemented by populating electronic components at specific locations on the product PCB. UIDs can be assigned to product PCBs as well as master PCBs.

The manufacturing system can include one or more software modules that provides the intelligence to perform the above described and other manufacturing functions. The software modules can include programmatic instructions and/or data stored in the memory of computing devices included in the manufacturing system. The modules can each include a database or, alternatively, have access to a common database.

As shown in FIG. 1, the manufacturing system 100 can include a pre-optimization module 102, a component placement module 104, a module 106 for queuing customer orders (i.e., a queuing module), and an execution control module 108. The pre-optimization module 102 allocates feeder and placement mechanisms. The module can generate analysis board files and workload files. (Analysis board files are described below.) The component placement module 104 allocates placements task among available component placement machines whose feeders and placement mechanisms have been allocated. The module can generate virtual master PCB files, which are described below. The queuing module 106 manages customer orders, including allocating customer orders to manufacturing lines. The execution control module 108 provides the intelligence for other manufacturing functions, examples of which include but are not limited to PCB fabrication and/or preparation, PCB assembly, product assembly, product testing, product reworking, and packaging and shipping. The manufacturing system 100 can include a data link 110 that allows instructions and data regarding processing activities to be exchanged between or among modules. Data link 110 can be, for example, a bus or a data communication link in a network.

Generating Product Files

Figure 2:
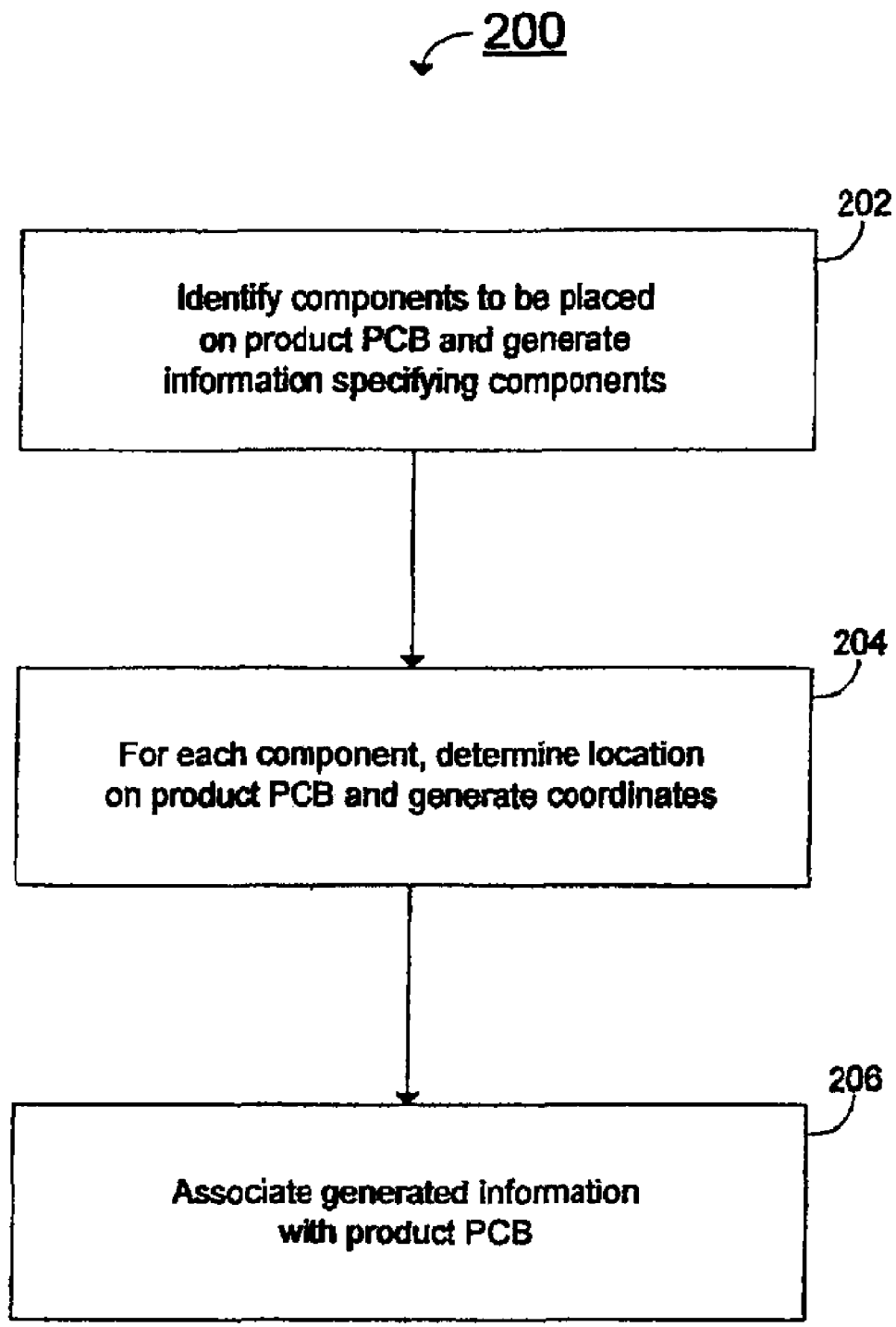
FIG. 2 shows a method for generating a product file.

FIG. 2 shows a method 200 for generating information in a product file. A system performing method 200, for example, the above described manufacturing system 100, identifies components to be mounted on a printed circuit board of a product and generates information that specifies the components (step 202). As discussed above, the system can extract the information from a CAD file that describes a particular master PCB that includes the product PCB. The master PCB can include other product PCBs.

Figure 3A:
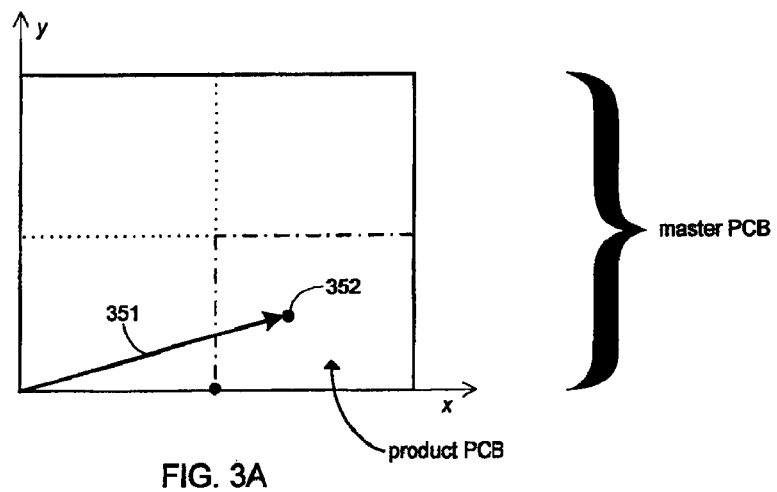
FIG. 3A shows an example of coordinates using a frame of reference relative to a master PCB.
Figure 3B:
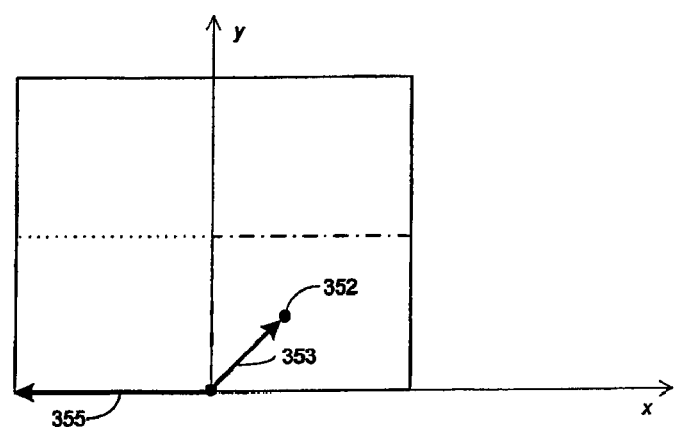
FIG. 3B shows an example of coordinates using a frame of reference relative to a product PCB.

For each of the identified components, the system determines the location on the product PCB where the component is to be mounted and generates coordinates that specify the location (step 204). The coordinate generated is of a coordinate system that has a frame of reference independent of any master printed circuit board. Generating such coordinates can include converting the coordinates included in the CAD file into coordinates having a frame of reference that is independent of the master PCB. The coordinates generated can have a frame of reference that is relative to the product PCB. FIG. 3A shows an example of coordinates that have a frame of reference relative to the master PCB. Vector 351 points, from a master PCB frame of reference, to a particular placement location 352 on a product PCB. FIG. 3B shows an example of coordinates that have a frame of reference relative to the product PCB. Vector 353 points, from a product PCB frame of reference, to the same placement location 352.

Figure 3C:
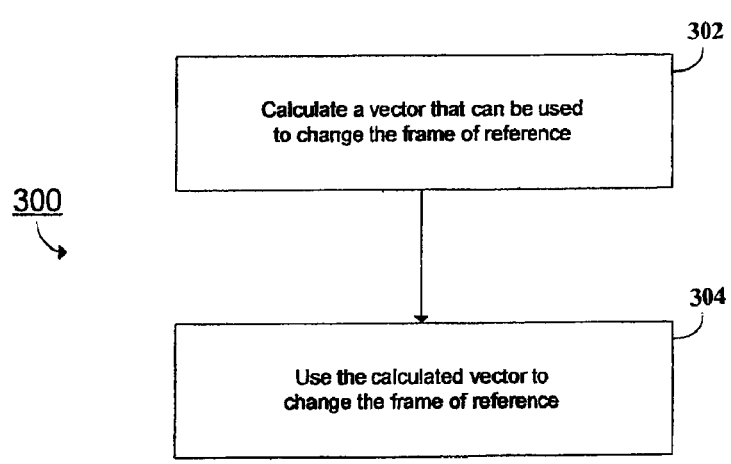
FIG. 3C shows a method for changing reference frames of coordinates.

FIG. 3C shows a method 300 for changing the frame of reference of the coordinates shown in FIGS. 3A and 3B. For ease of exhibition, the coordinates shown are of a two-dimensional Cartesian coordinate system. It should be noted that any other type of coordinate system, for example, a polar coordinate system, can be used. Furthermore, the vectors are typically situated in a three-dimensional space. The system calculates a vector that can be used to change the frame of reference (step 302). Generally, the vector can be one that originates from the origin of a coordinate system having a frame of reference relative to the product PCB and points to the origin of a coordinate system having a frame of reference relative to the master PCB. Vector 355 (FIG. 3B) is an example of such a vector. The system associates the generated information with the master PCB. The generated information (e.g., vector 355) can be stored in a platform file, which can be stored as persistent data in a database. The database can include a library of multiple master PCBs that can be later used, among other functions, to generate virtual master PCBs (as will be described below). The system uses the calculated vector to change the frame of reference (step 304). The system can store the vectors in matrices and use mathematical transforms to effect the change of reference frame. Alternatively, the system can simply add and/or subtract the vectors as needed to effect the change.

After determining location, the system associates the generated information with the product (step 206 of FIG. 2). As discussed above, the generated information can be stored in a product file, which can be stored as persistent data in a database. The database can include a library of multiple product PCBs that can be later used, among other functions, to configure component placement machines and design master PCBs, as will be described below.

A system performing method 200 can identify the layout of a PCB product and generate information that specifies the layout. As discussed above, a layout of a PCB is the arrangement of, for example, traces, vias and/or insulating materials forming the board. The layout also can include the spatial arrangement of other components, elements, materials and parts. For each data value representing a location in the layout information, the system can generate information that specifies coordinates that indicate the location using a frame of reference independent of any master printed circuit board using the method 300 for changing the frame of reference of the coordinates; and, associate the generated information with the product. The generated information can be stored in a product file.

Configuring Placement Machines

Figure 4:
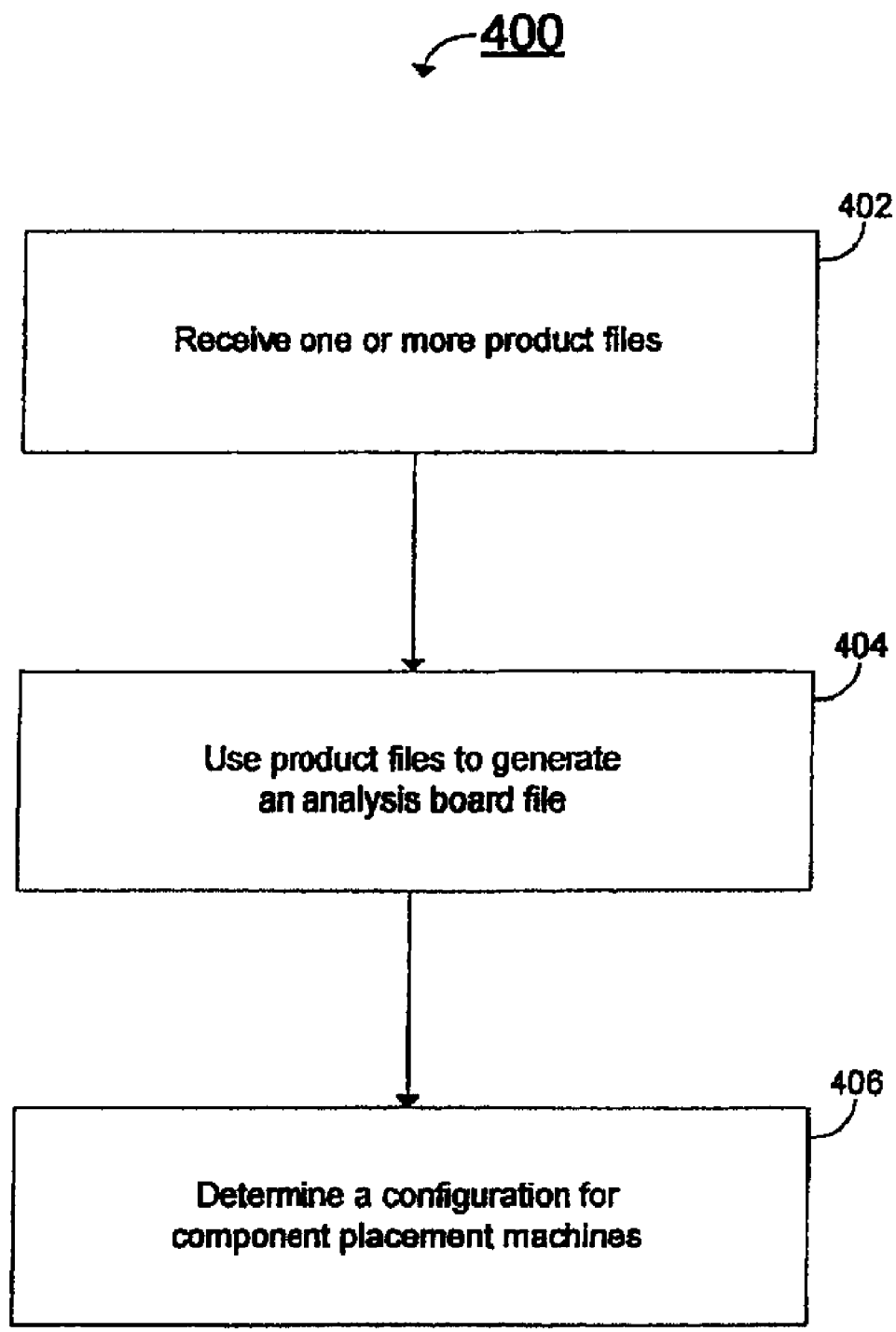
FIG. 4 shows a method for configuring component placement machines.

FIG. 4 shows a method 400 for configuring one or more component placement machines of a manufacturing line. A system performing method 400, for example, the above described manufacturing system 100, receives one or more product files for one or more products (step 402). Each product file includes information that specifies a layout of a printed circuit board of a product. As discussed above, a placement layout of a printed circuit board is a spatial arrangement of locations on the printed circuit board where electronic components are to be placed and a mounting configuration of each location. The product file further includes information that specifies a component configuration of the printed circuit board, which indicates a type of component to be mounted for each location indicated in the placement layout information of the product PCB.

The system uses the product file for the one or more products to generate an analysis board file for the one or more products (step 404). The analysis board file includes information that describes the placement layout of a master PCB that includes some particular combination of product PCBs for the one or more products.

The generation of the analysis board file can include defining the placement layout of a master PCB that includes a particular combination of product PCBs for the one or more products. The particular combination used can be a pre-determined combination or, alternatively, based on consumer demands for the one or more products. If, for example, the demand for a first product is twice the demand for a second product, then the master PCB could include two product PCBs for the first product for every one product PCB for the second product.

The generation of the analysis board file can also include converting coordinates of each product PCB into coordinates having a frame of reference relative to the master PCB. The conversion here is, in a sense, a reverse of the conversion process described in reference to FIGS. 3A-3C. The information needed to convert the frame of reference can be extracted from each product file associated with each product PCB and the platform file associated with the master PCB.

The system determines a configuration for a component placement machine (step 406). The determining is based on the generated analysis board file for the one or more products and also on the particular component placement machines.

Configuration can include determining which of the types of components specified in the product files for the one or more products to load into which feeder of the one or more component placement machines and which placement mechanisms will be used to populate the components. The system can use any well known optimization routines to make the determination. Input to the routine typically includes information included in the analysis board file and information describing the one or more component placement machines.

A system performing method 400 can receive one or more product files. The system uses the product file for the one or more products to generate (or append to) an analysis board file for the one or more products. The analysis board file include information that describes a master PCB that includes some particular combination of product PCBs for the one or more products. The system determines a configuration for equipment in a manufacturing system including one or more component placement machines. The determining is based on the generated analysis board file for the one or more products and also on the particular component placement machines.

Note that the analysis board file, as well as any other files described in the present specification, can have a format consistent with well known industry standards so that information stored in the files can be accessed by a third-party applications, for example, applications that execute the above described optimization routine.

Once the manufacturing line has been configured, the manufacturing line is ready to produce any combination of the one or more products specified by the one or more product files used to generate the analysis board file. The system can use the manufacturing line in a built-to-order manufacturing method, as will be described below. If it is determined that the manufacturing system should be used to produce additional or some other combination of products, then the system can repeat the above described method 400 to reconfigure the manufacturing line.

Input to the optimization routine can include multiple analysis boards. The manufacturing line may be configured to produce any combination of the one or more products specified by the one or more product files used to generate the analysis board files.

Note that the configuration can be manually overridden by a user, who may choose to otherwise configure the component placement machines.

Built-to-Order Manufacturing Using Product Files

Figure 5:
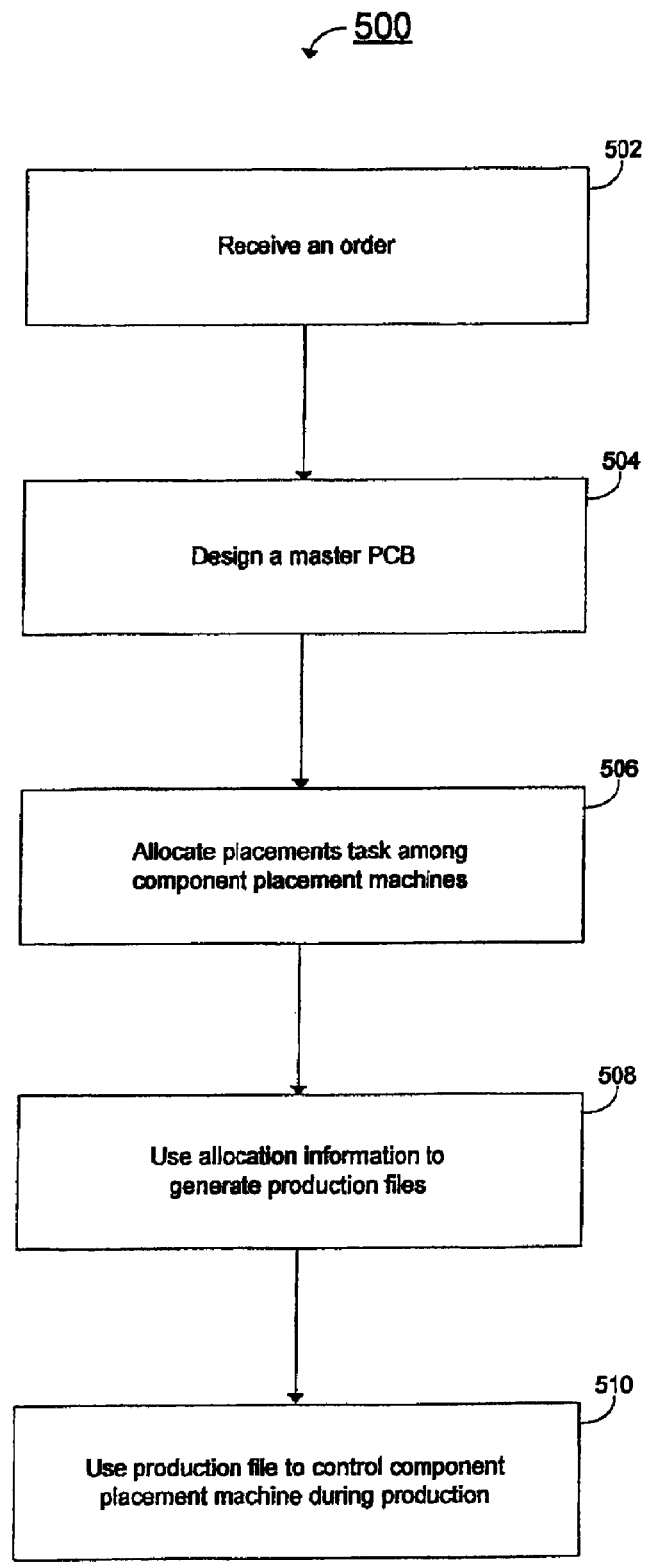
FIG. 5 shows a built-to-order manufacturing method.

FIG. 5 shows a built-to-order manufacturing method 500. A system performing method 500, for example, the above described manufacturing system 100, receives a customer order that specifies a particular combination of the one or more products (step 502). The system designs a master PCB that includes a combination of product PCBs that fulfils the customer order (step 504). The master PCB design can be based, for example, on the layout of the product PCBs and on the particular combination of the one or more products required by the order. The system can optionally store the master PCB design in a virtual master PCB file. The system then applies an optimization routine to allocate placement tasks among the available component placement machines of the manufacturing line, given a fixed allocation of feeders and placement mechanisms (step 506). The feeders and placement mechanisms could have been configured using a method, for example, method 400, to optimize the component placement machines to efficiently manufacture the products. The optimization routine can be any well known routine for allocating placement tasks. The system uses the determined allocation and information describing the master PCB and creates one or more production files (step 508). A production file, which is different than a product file, is specific to a particular component placement machine and a particular master PCB being assembled. That is, a production file has control information specific to one or more placement heads in a component placement machine and also to a particular master PCB. The system then uses the production files to control the component placement machines to produce the product PCBs of the customer order (step 510).

Workload Files

Optionally, the system can use workload files to reduce the amount of computing resources needed in the above described built-to-order manufacturing process. A workload file can be generated before production (e.g., before orders are received) and includes all instructions needed to cause a particular placement head to at least partially populate a master PCB having a particular combination of the one or more products. The workload file contains instructions needed for the placement head to complete its allocated placement task or tasks. The allocation of placement task or tasks can be determined by one or more optimization routines, for example, the optimization routines utilized by the pre-optimization module 102 and the component placement module 104. The system can store workload files as persistent data in a database for later use. In the above described built-to-order method 500, the system can check to see if the appropriate set of one or more workload files are available. If the set of workload files is available, then the system can use the available workload files to generate production files for manufacturing the master PCB and need not generate a master PCB file.

In one implementation, workload files include all instructions needed to cause a particular placement head to populate, at least partially, a product PCB of a specific master PCB. The workload file can be associated to the master PCB, the particular placement head, and the product PCB. Furthermore, the workload file can be associated to the product PCB's location on the master PCB. In this implementation, the manufacturing system creates a workload file for every potential production combination for the one or more products to be produced on the master PCB on the manufacturing line. The line is ready to assemble any combination of product PCB/s on the master PCB. Then, the system can use the available workload files to generate production files and need not generate a virtual master PCB during assembly of any combination of the product PCBs on the master PCB.

A Manufacturing System

Figure 6:
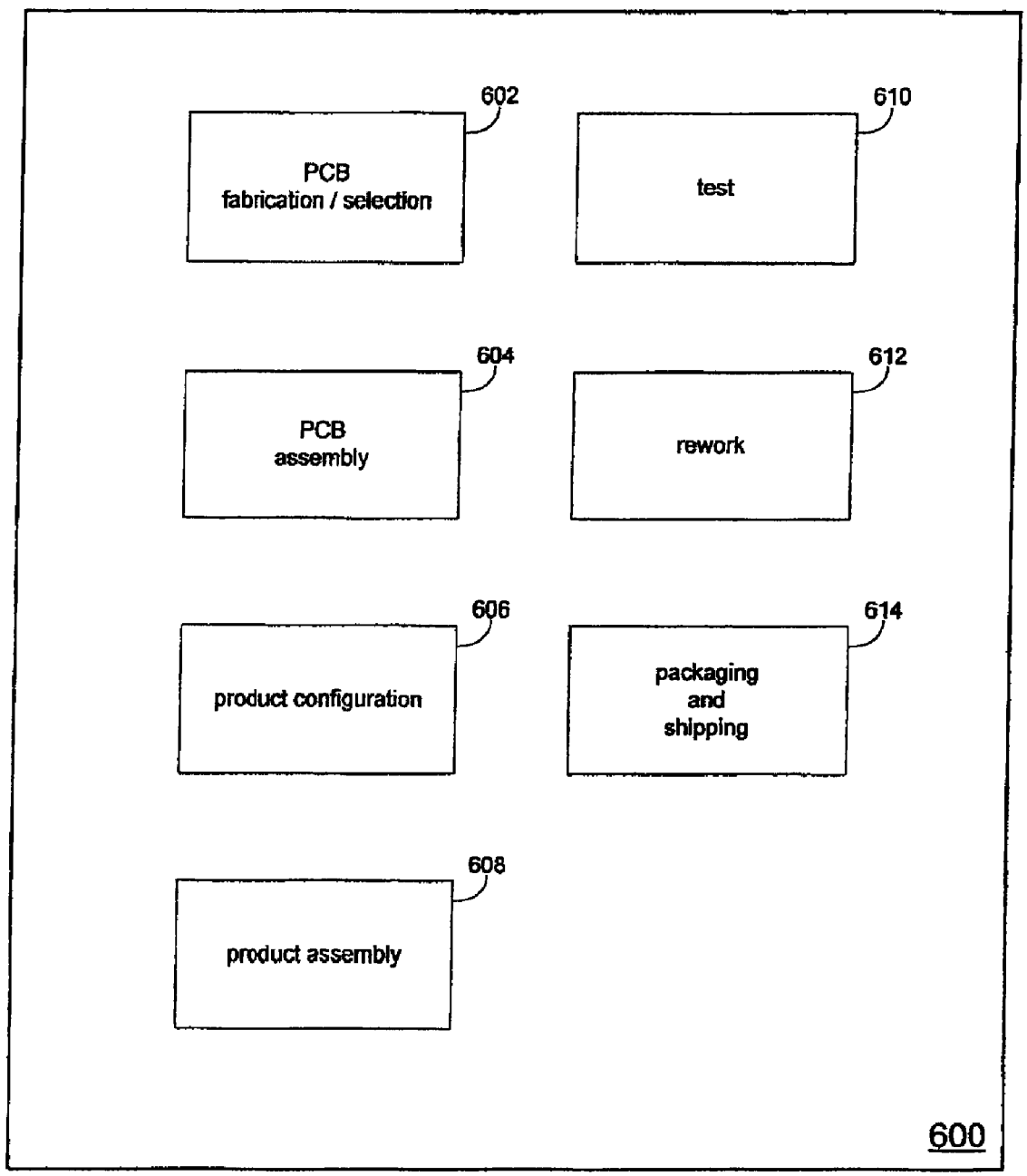
FIG. 6 shows a block diagram of a manufacturing system.

FIG. 6 shows a manufacturing system 600 in which aspects of the invention can be implemented. System 600 can be used to manufacture products that typically include a PCB. System 600 can include a PCB fabrication/selection component 602, a PCB assembly component 604, a product configuration component 606, a product assembly component 608, a test component 610, a rework component 612, and a packaging and shipping component 614. These components of system 600 can be combined, distributed among different geographic locations, and may be owned by different enterprises. System 600 can include other components, for example, one for effecting quality assurance processes beyond product testing. System 600 can also include the above described software modules.

Figure 7:
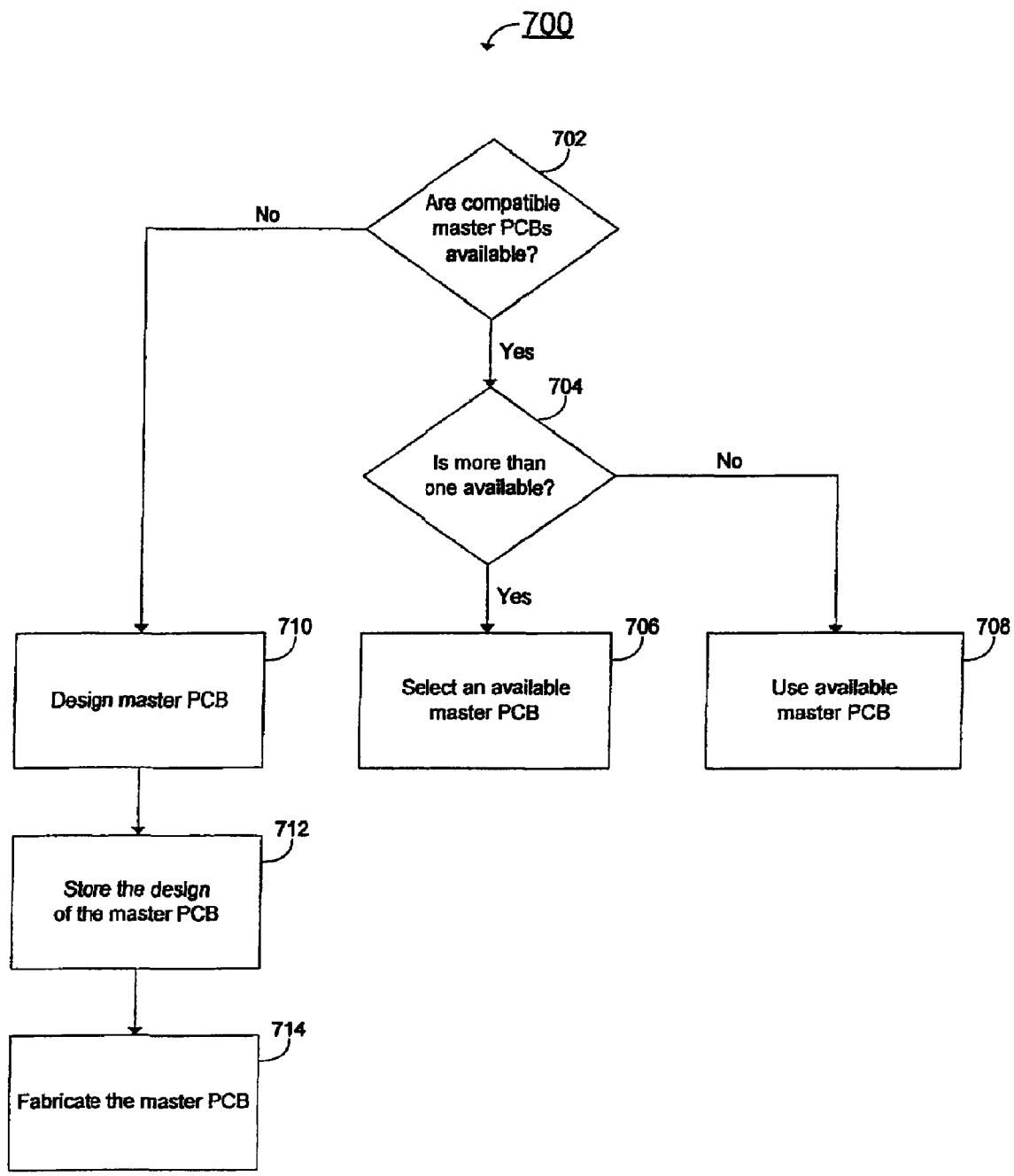
FIG. 7 shows a method for fabricating master PCBs.

PCB fabrication/selection component 602 fabricates or selects a previously fabricated master PCB. The fabrication and selection can be made in accordance with an order. As shown in FIG. 7, PCB fabrication/selection component 602 can, given an customer order specifying a particular combination of products, determine if a master PCB needs to be fabricated. The determination can be based, for example, on whether one or more compatible master PCBs are available (step 702). A master PCB is compatible when the layout of the master PCB can accommodate the layouts of the combination of product PCBs specified by the order. If one or more compatible master PCBs are available, then PCB fabrication/selection component 602 determines if more than one are available (step 704). If it is determined that more than one compatible master PCBs are available, then PCB fabrication/selection component 602 selects one of the available master PCBs (step 706). Selection can be made based on various criteria, for example, cost, storage location, and number in stock. If only one compatible master PCB is available, then PCB fabrication/selection component 602 uses the compatible master PCB (step 708). If a compatible master PCB is not available, then PCB fabrication/selection component 602 uses product specific information to design a master PCB that is compatible with the customer order (step 710). PCB fabrication/selection component 602 stores the design of the master PCB (step 712). PCB fabrication/selection component 602 fabricates the master PCBs in accordance with the design (step 714).

PCB assembly component 604 populates and further processes master PCBs. Populating refers to the placement of electronic components onto a master PCB. Processing includes, for example, applying pastes and/or adhesives, curing, soldering, depaneling, optical inspection, as well as other well known PCB assembly processes.

Figure 8:
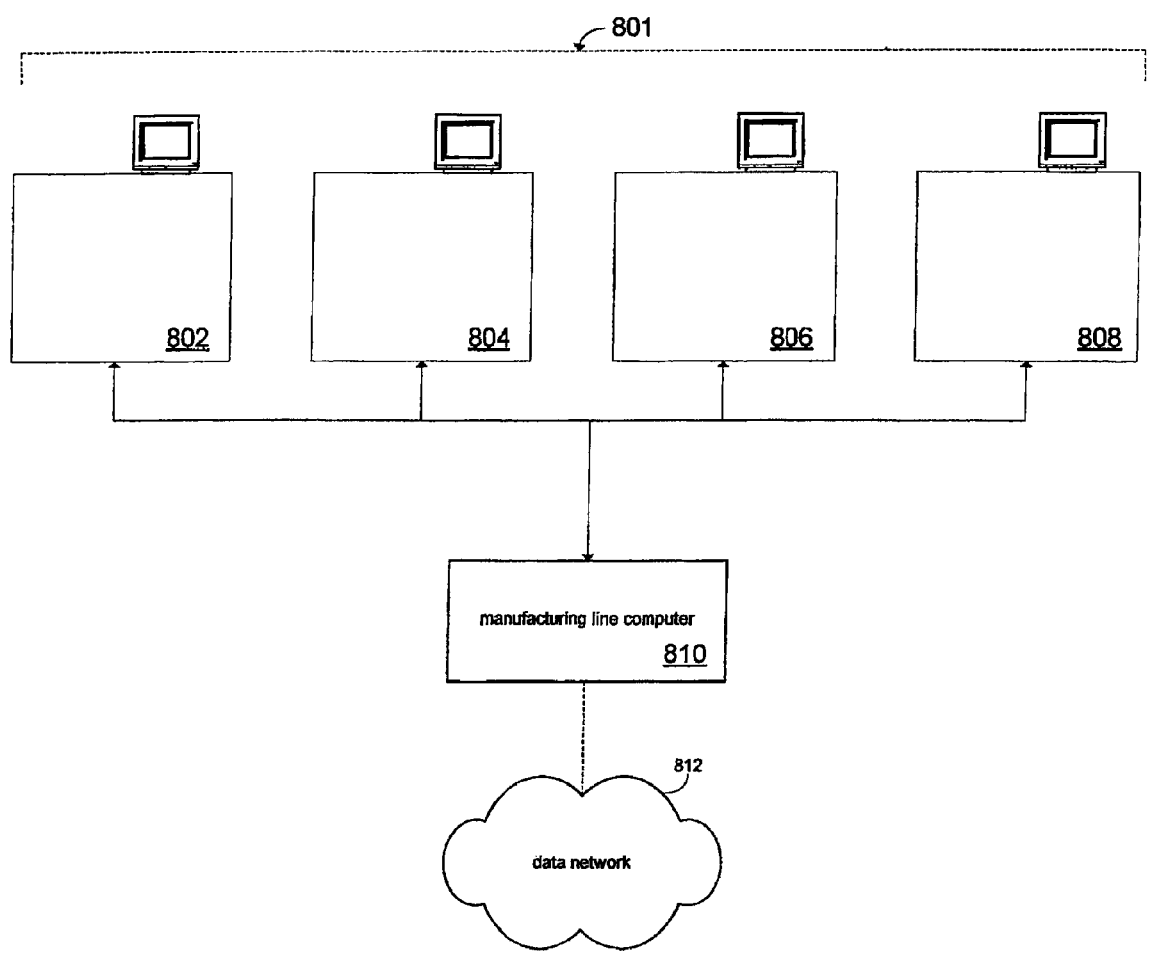
FIG. 8 shows a block diagram of component placement machines of a manufacturing line.

PCB assembly component 604 can include one or more component placement machines. FIG. 8 shows an example of a manufacturing line 801 that includes four component placement machines 802, 804, 806, and 808. As can be seen, a manufacturing line computer 810 controls the component placement machines. The production file can be stored on the manufacturing line computer. Optionally, production files can be sent to the manufacturing line computer from an external server and through a network 812. The network can include internal and external servers. A component placement machine typically operates under the control of an internal computer, which can provide control in accordance with information included in a production file. In one implementation of the manufacturing system, the manufacturing line computer determines the appropriate production files to provide each component placement machine, the determining being based upon the particular combination of product PCBs on each master PCB being assembled in each component placement machine.

Product configuration component 606 configures the products in accordance with the order. Configuration can include, for example, the programming of memory and the loading of software and/or firmware. Optionally, product configuration can be performed before the master PCB is separated into product PCBs.

Product assembly component 608 performs the final assembly of the product, including assembling the product PCB with the product's other parts. Testing component 610 performs tests on the assembled products. Testing can include well know function checks including, for example, ensuring that the product has been configured correctly. Packaging and shipping component 612 packages and prepare products for shipping in accordance with a particular order. These functions can optionally be separated into different components of the system 600. Rework control module 614 manages any customer orders removed from production and ensures that such customer order are fulfilled.

The above described components, which are components used in a production stage of manufacturing, can include any combination of software and hardware. In addition to these production stage components, system 600 can also include components used in a pre-production stage. For example, system 600 can include the above described pre-optimization module 102 and component placement module 104 (FIG. 1). Note that system 600 can include multiple manufacturing lines, each of which can include one or more component placement machines.

Implementations of Manufacturing Methods

The following paragraphs describe implementations of manufacturing methods that system 600 can perform. These methods can be performed by one or more of system 600's components and/or software modules.

Figure 9:
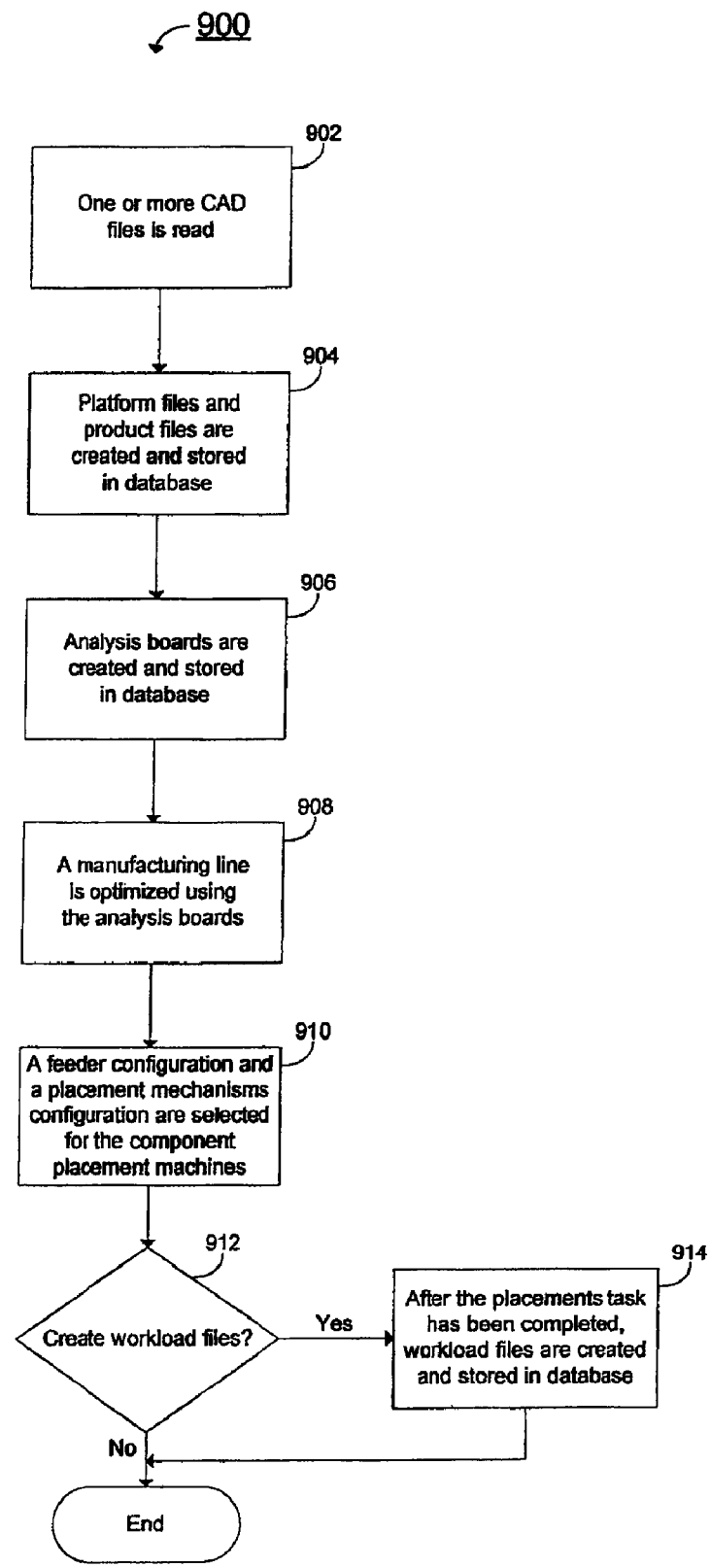
FIG. 9 shows a method for preparing a manufacturing system production.

FIG. 9 shows a method 900 for preparing system 600 for production. System 600 can use the above described pre-optimization module 102 in performing method 900. System 600 receives and reads one or more CAD files (step 902). The CAD files can be stored in a database. System 600 creates one or more product files and platform files and stores the files in the database (step 904). The product files and platform files can be created as described above. System 600 creates one or more analysis board files and stores the files in the database (step 906). The analysis board files can be created as described above. System 600 optimizes a specific manufacturing line using one or more analysis board files (step 908). Optimizing a manufacturing line using an analysis board file includes determining a configuration for each component placement machine, for example, determining the feeder configuration and placement mechanisms configuration. System 600 allocates feeders and placement mechanisms for the manufacturing line (step 910). Allocation can be effected as described above. Other manufacturing functions may be optimized using any well known optimization routines by using the one or more analysis board files. System 600 determines whether workload files are needed (step 912). Workload files can be determined to be needed, for example, according to user preference. If it is determined that workload files are needed, then system 600 allocates the placement tasks among or between the component placement machines of the manufacturing lines and creates workload files (step 914). System 600 can use method 1000 for allocating placements task among the component placement machines of a manufacturing line. If workload files are not needed, then system 600 has completed the preparation method 900.

Figure 10:
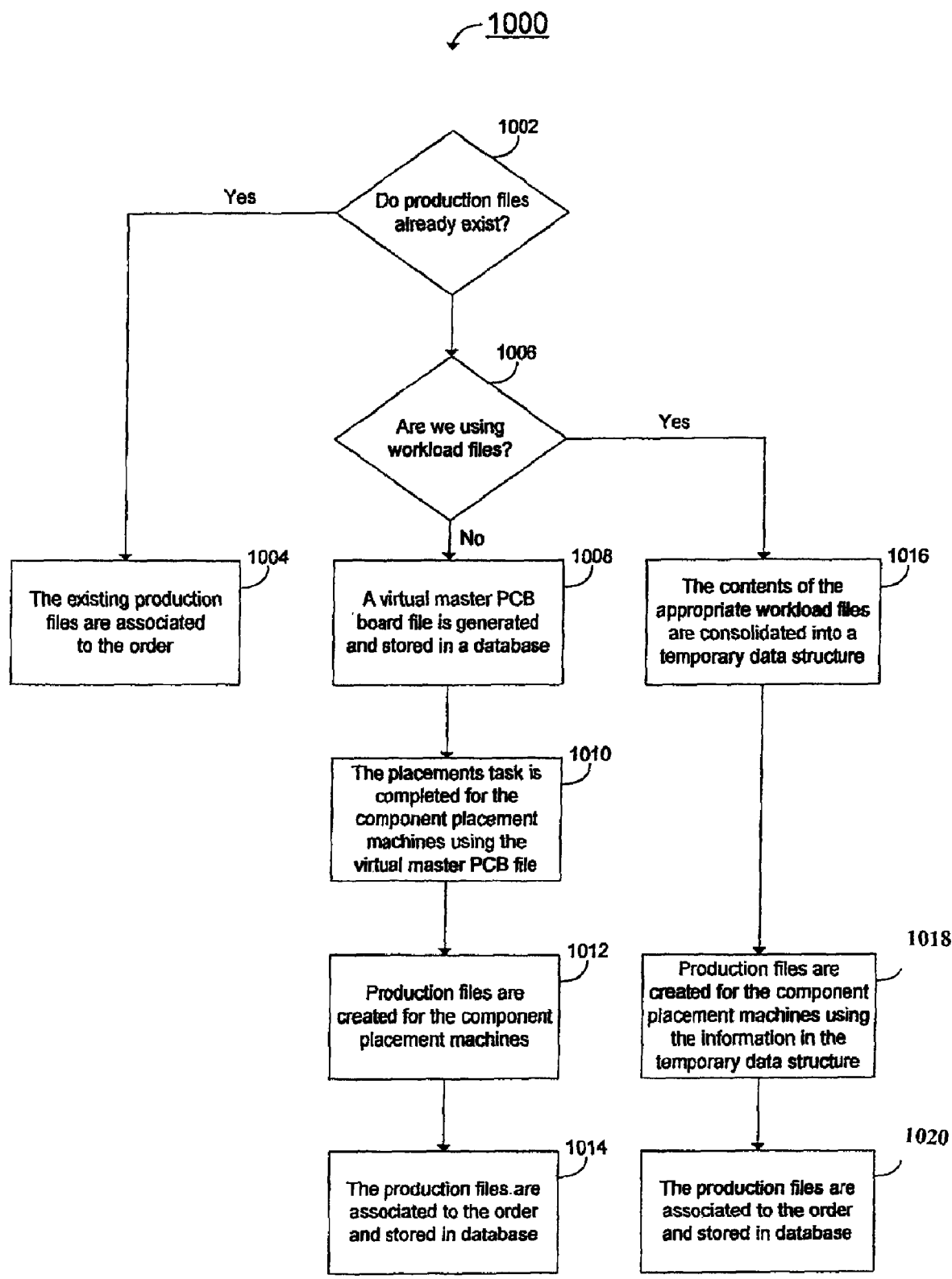
FIG. 10 shows a method for allocating placement tasks among component placement machines of a manufacturing line.

FIG. 10 shows a method 1000 for allocating placements task among the component placement machines of a manufacturing line, given a particular combination of product files (as specified, for example, by a customer order). System 600 can use the above described component placement module 104 in performing method 1000. System 600 determines if there are accessible production files that can be used to fulfill the customer order (step 1002). If such production files exists, then system 600 associates the production files with the customer order (step 1004). Otherwise, system 600 determines if workload files are to be used (step 1006).

If workload files are not to be used, then system 600 performs steps 1008-1014. System 600 designs a master PCB given the requirement of the particular combination of product files and stores the virtual master PCB design (step 1008). The master PCB design information includes information specifying the placement layout and component configuration of the master PCB. System 600 executes an optimization routine and allocates placements tasks given the master PCB created and the configuration of the component placement machines (step 1010). System 600 creates production files given the allocation of placement tasks (step 1012). System 600 associates the production files with the customer order and stores the production file in the database (step 1014). The production file can be later used to fulfill customer orders.

If workload files are to be used, then system 600 performs steps 1016-1020. System 600 consolidates appropriate workload files into a temporary data structure (step 1016). Appropriate workload files for a customer order are the workload files that can be used to process the customer order. System 600 creates production files using information from the workload files that are stored in the temporary data structure (step 1018). The production files could have been created such that components of the same type will be placed in series by each placement head. System 600 associates the production files with the customer order and stores the production files in the database (step 1020).

Figure 11:
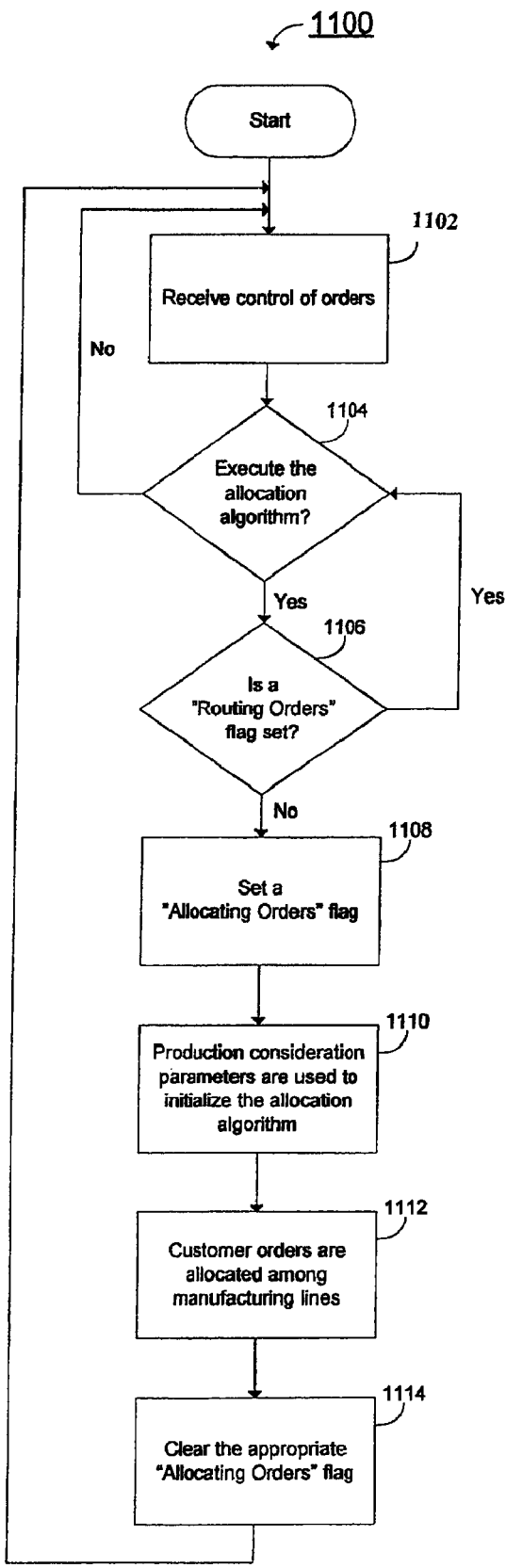
FIG. 11 shows a method for allocating orders received to one or more manufacturing lines.

FIG. 11 shows a method 1100 for allocating orders received to one or more manufacturing lines. System 600 can use the above described queuing module 106 in performing method 1100. As shown, system 600 receives an customer order (step 1102). The customer order can be received from a customer ordering system or from the above described rework component 614. System 600 determines if there is a request to allocate orders (step 1104) among available manufacturing lines. Such requests can be specified by a user, either to be made automatically at particular time intervals or as a one-time request. If there is currently no request to allocate orders, then the system 600 continues to queue (i.e. receive and store) orders. Otherwise, system 600 determines whether a routing orders flag is set (step 1106). Such a flag is set when the previously allocated customer orders are currently being routed to a manufacturing line. If the routing customer order flag is set, then system 600 can wait until the flag clears. If no routing customer order flag is set, then system 600 sets an allocating customer order flag (step 1108) and proceeds to perform steps 1110-1114. System 600 initializes the allocation routine in accordance with given production parameters, including, for example, the available capacity, capacity utilization, geographic location, manufacturing capabilities and manufacturing schedule of the manufacturing lines in a manufacturing system (step 1110). System 600 executes the customer order allocation routine (step 1112). Allocation can result in the assignment of more than one manufacturing line to fulfill the order. When allocation is complete, system 600 clears the allocating customer order flag (step 1114) and returns to a state in which system 600 continues to queue orders.

Figure 12:
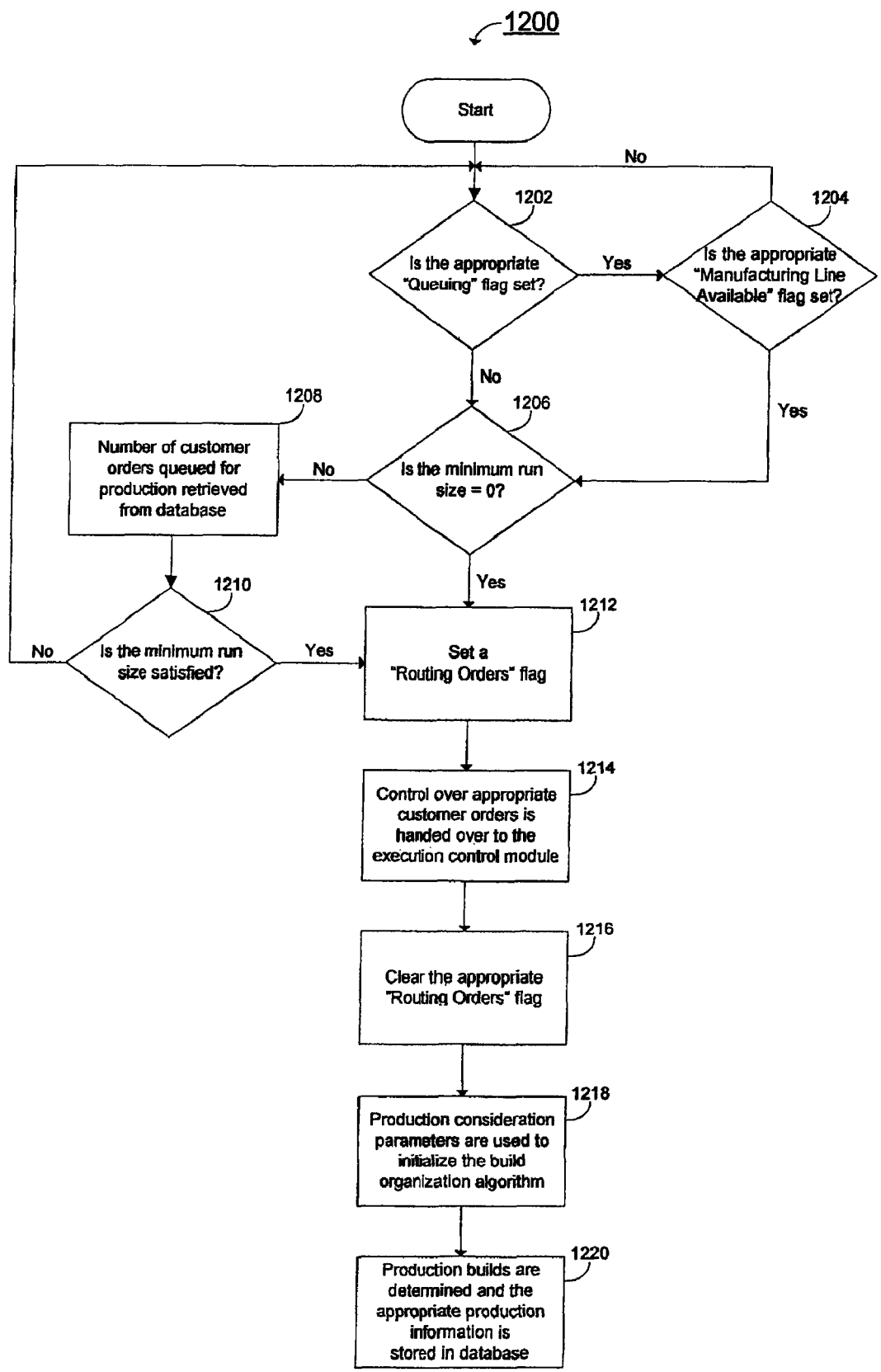
FIG. 12 shows a method for initiating a manufacturing run on a particular manufacturing line.

FIG. 12 shows a method 1200 for initiating a manufacturing run on a particular manufacturing line. Method 1200 organizes orders that have been released for production and routed to a particular manufacturing line for a build (which refers, in the present specification, to a run of a manufacturing line, producing a master PCB that includes the product PCBs of the orders assigned to the run). The orders can be allocated to builds based upon an optimization algorithm that maximizes build throughput for a particular manufacturing line. System 600 can use the queuing module 106 and execution control module 108 in performing method 1200.

System 600 determines if orders are being queued (step 1202). System 600 can make such a determination by, for example, checking to see if a queuing flag has been set. Such a flag can be set automatically by system 600 or manually by a operator. If it is determined orders are being queued, i.e., the queuing flag is set, then system 600 can wait until instructed to release orders to the manufacturing line. In one implementation, a manufacturing line available flag is checked to determine if orders should be released to the line (step 1204). The manufacturing line available flag can be set automatically by the system 600 or manually by an operator. If the manufacturing line available flag is not set, then system 600 returns to its initial state, which is to determine if orders are being queued. When the queuing flag is not set, or the queuing flag is set and the manufacturing line available flag is set, then system 600 proceeds to the next step.

System 600 determines if there is a minimum run size for the manufacturing run (step 1206). System 600 can check a minimum threshold set by the operator. A minimum manufacturing run size of zero indicates that there are no minimum requirements. When the minimum run size is greater than zero, system 600 will retrieve the number of customer orders available for production on the manufacturing line (step 1208) and determine if the number of orders is sufficient to begin production (step 1210). If the minimum run size has not been achieved, then system 600 returns to its initial state, which is to determine if customer orders are being queued.

When no minimum run size is required or the minimum run size requirement has been satisfied, system 600 begins the process of routing customer orders to the manufacturing line by setting a routing order flag (step 1212). Control over the appropriate customer orders is passed from the queuing module to the execution control module (step 1214). The change in control can be noted in both a queuing module database and a database of the execution control module. Step 1214 may not involve transferring control of sets of customer orders sufficient to fully populate master PCBs. Such a situation may occur if the operator wishes to manufacture master one or more PCBs that are not fully populated. After control over all orders involved in the manufacturing run has been transferred, the appropriate routing order flag is cleared (step 1216).

Production consideration parameters are used to initialize (step 1218) a routine that organizes all of the customer orders that have been released to production. The production consideration parameters can be customized to the needs of the specific manufacturing line. Builds for the manufacturing run are configured and the build information is stored in the execution control system 600 database (step 1220).

Those of ordinary skill in the art will realize that an optimal organization may differ based upon the products being produced (i.e. the product mix), the volume of each product being produced, and the set of one or more manufacturing lines being used to produce a particular product. Fore example, the capacity, efficiency, and setup time of the equipment on the manufacturing line may impact the optimal configuration.

The operator can define build allocation parameters that can influence the allocation routine. For example, for a particular manufacturing line, the operator may wish to produce in series all product PCBs that utilize the same product PCB layout and that have the same component configuration (e.g. batch process product PCBs with the same layout and component configuration). Alternatively, an operator may take into consideration the possibility that different product designs based on the same product PCB layout can have different component configurations. The various component configurations may have different manufacturing requirements. For example, one component configuration may require populating more components on a PCB panel than another component configuration. Product PCBs having different layouts can be included on the same master PCB. The operator can allow the manufacturing system to produce in series all product PCBs without regard to particular component configurations or to produce in series product PCBs having different layouts.

Figure 13:
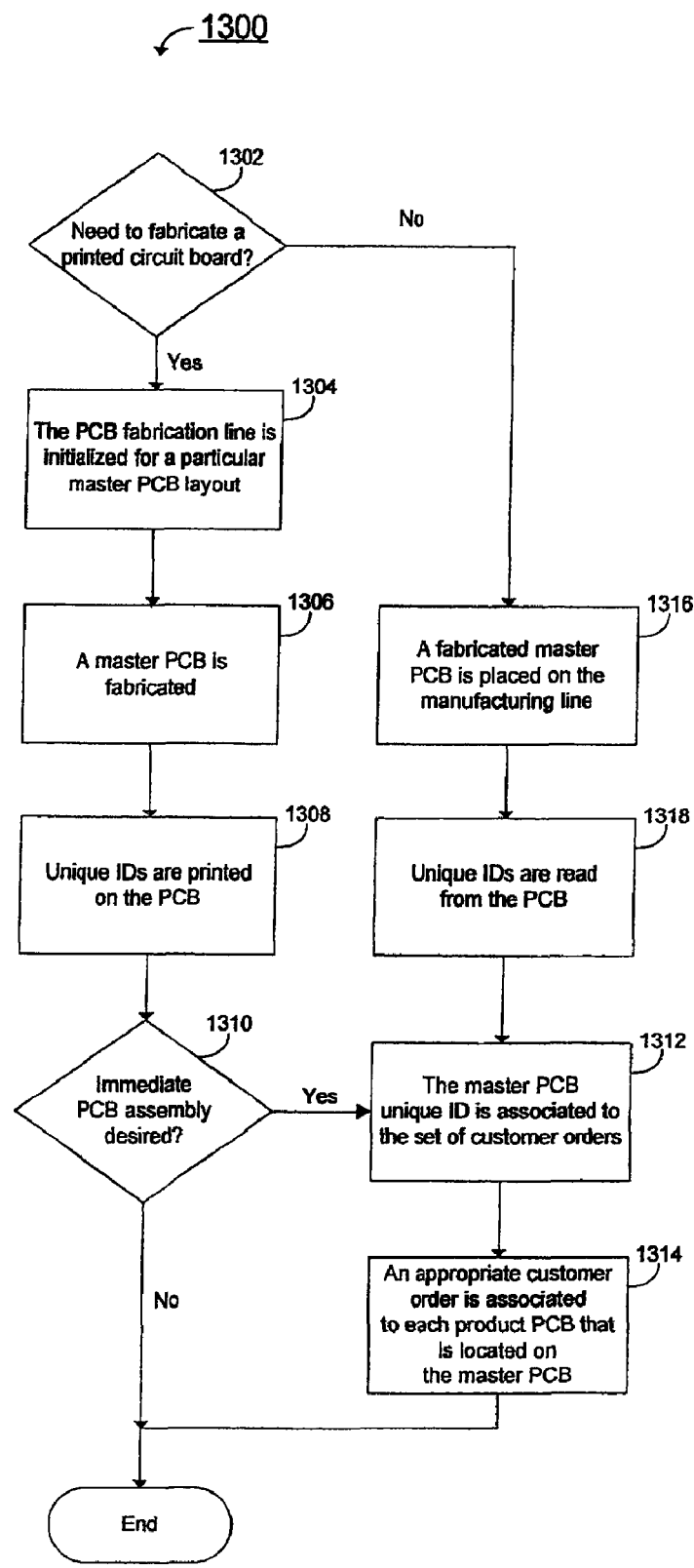
FIG. 13 shows a method for fabricating/preparing a PCB.

FIG. 13 shows a method for fabricating/preparing a PCB. As discussed above, orders can be fulfilled by using one or more printed circuit boards. A master PCB board is typically used to fulfill a number of individual customer orders. A component of each customer order will be produced on an individual product PCB, which is located on the master PCB. The master PCBs in the build include product PCB layouts that are compatible to the set of products to be produced on the product PCBs. The build configurations for each master PCB may have been determined earlier in the above described initialization method. System 600 can use PCB fabrication/selection component 602 and a corresponding software module (i.e., one that provides the intelligence for the PCB fabrication/selection) in performing method 1300.

As shown in FIG. 13, system 600 determines if a PCB is going to be fabricated (step 1302). If a master PCB needs to be fabricated, then system 600 provides the appropriate initialization and configuration information to a PCB fabrication line (step 1304). To simplify compatibility issues, all of the PCB fabrication preparation setup steps can be completed using industry standard formatted files, for example, Gerber file formats, to enable the use of third-party software where applicable. The information may be stored in pre-processed file formats that are compatible to individual pieces of PCB fabrication equipment. The execution control module 108 can provide information regarding, for example, the layout films to be used in the PCB fabrication process, the chemicals to be used in the PCB fabrication process, drilling recipes, and other machine configuration information. The information may include information regarding passive components embedded in a PCB.

After the PCB fabrication line has been properly configured, a PCB is fabricated (step 1306). The master PCB can include one or more unique identifications or UIDs (step 1308). A UID can be provided to identify the master PCB and UIDs can be provided for each product PCB located on the master PCB. The UIDs can be provided by the execution control system, which can store the UIDs in a database.

System 600 determines whether the PCB will be put in a queue for immediate PCB assembly (step 1310). If the PCB will not be queued for immediate assembly, then system 600 has completed the fabrication method 1300. Otherwise, system 600 proceeds to step 1312. System 600 associates one or more orders with the master PCB (step 1312). The association can be made based on the build information stored from the above described initialization process. The master PCB's UID can be stored in a data structure containing the customer order numbers from each associated order. Each customer order included in the build is associated with an individual product PCB on the master PCB (step 1314). The product PCB's UID number can be stored in a data structure, which contains all of the information required to produce and track the order. The data structure can be stored in a database of the execution control system. Note that because the layout of the master PCB is known, one can assume that the layout of each product PCB is also known.

If there is no need to fabricate a PCB because, for example, a compatible master PCB has been previously fabricated, then system 600 loads the fabricated master PCB on the manufacturing line (step 1316). Before continuing further down the manufacturing line, all UIDs are read from the master PCB, for example, the UIDs are read by a scanner (step 1318). The UIDs can be provided to the execution control module 108, which can store the UIDs in its database for future use. System 600 proceeds to steps 1312 and 1314, which were described above, and completes the fabrication method 1300.

Figure 14:
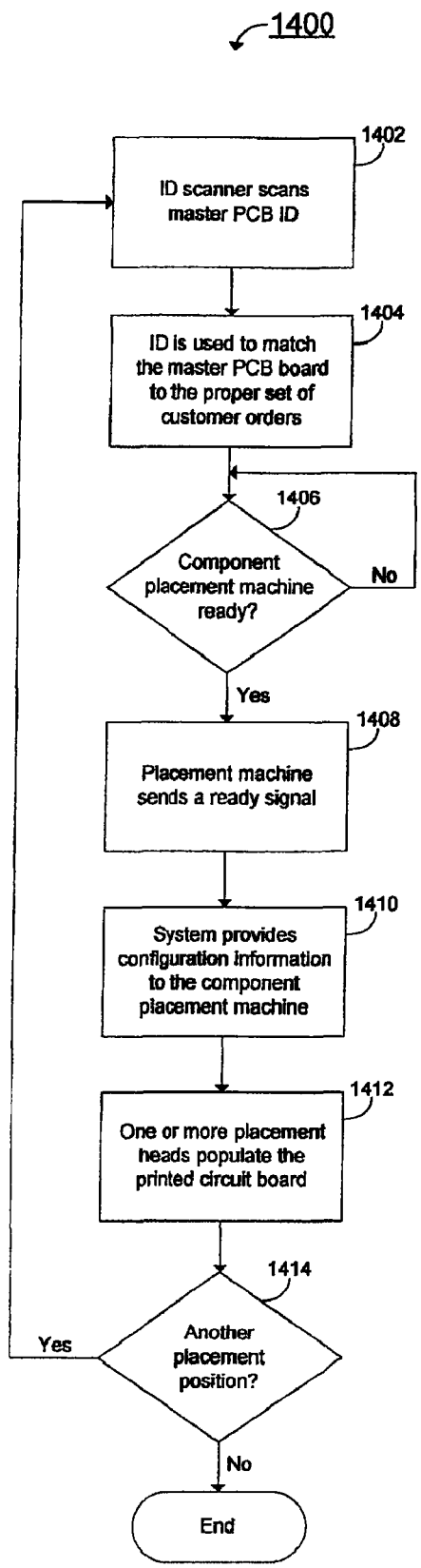
FIG. 14 shows a method for assembling a PCB.

FIG. 14 shows a method 1400 for assembling a PCB. System 600 can use PCB assembly component 604 and a corresponding software module (i.e., one that provides control for PCB assembly) in performing method 1400.

After a master PCB has completed all of the necessary preparation stages, the master PCB is populated with electronic components. The master PCB can be populated by one or more component placement machines. Before a master PCB is processed by a placement machine, the system 600 can read the UID that identifies the master PCB (step 1402) and store the UID in a database. The UID is used to match the master PCB to the appropriate orders (step 1404; recall that the orders were previously associated with the UID of the master PCB).

Step 1404 may or may not include the execution control module 108 outputting the master PCB's UID to a rework process of rework component 612. The rework process can be executed in any situation that involves a quality insurance issue. For example, the rework process can be executed if system 600 encounters an unexpected master PCB UID (indicating that a master PCB was probably pulled from the manufacturing line). As described above, the rework process ensures that any customer order removed from the normal system 600 process flow for any reason is properly fulfilled.

In one implementation, the proper customer order associated with each product PCB on the master PCB since each UID has been associated to a specific customer order. If necessary, the manufacturing system can create or change UIDs on the product PCBs and associate the UIDs with the customer orders. An alternative approach is to read the product PCB UIDs, which are each associated with a specific customer order.

System 600 determines whether the next gantry in the series of one or more gantries in the manufacturing process is ready to populate the master PCB (step 1406). When the placement machine sends a ready signal (step 1408), system 600 proceeds to steps 1410. Otherwise, system 600 waits for the ready signal. System 600 provides, if necessary, the information necessary to configure and control the gantry of the component placement machine, for example, machine initialization information, such as the master PCB alignment settings and master PCB clamping settings, and the proper production file (available from a database of the above described component placement system). Note that system 600 may have component placement module 604 concurrently interacting with multiple component placement machines. Note that the software of the component placement module 104 can have dedicated software routines and data stored locally on the component placement machine. The production file can be provided in a format that the placement machine can understand and act upon. The component placement machine then populates the master PCB based upon the contents of the production file (step 1414).

System 600 determines whether the master PCB must be populated in another placement position of the manufacturing line (step 1414). That is, the system 600 determines whether there are additional component placement tasks that must be completed. If there are, then system 600 moves the master PCB to the next placement location of the manufacturing line. If necessary, as may occur if the next placement location is located on a different component placement machine, the system 600 can re-execute the above described configuration process. The configuration process can begin as described in step 1402.

If the master PCB has been populated at the placement position in the series of component placement machines, i.e., all placement tasks have been completed, then the component placement process has been completed for the master PCB. The board continues to the next step of manufacturing according to existing industry standard techniques such as, for example, entering automated optical inspection equipment or reflow ovens.

The PCB assembly component 604 can complete the remaining PCB assembly steps, including, for example, controlling the application of pastes and adhesives, cleaning, adhesive curing, soldering, depaneling, automated optical inspection, and other steps in a PCB assembly process known in the industry.

Figure 15:
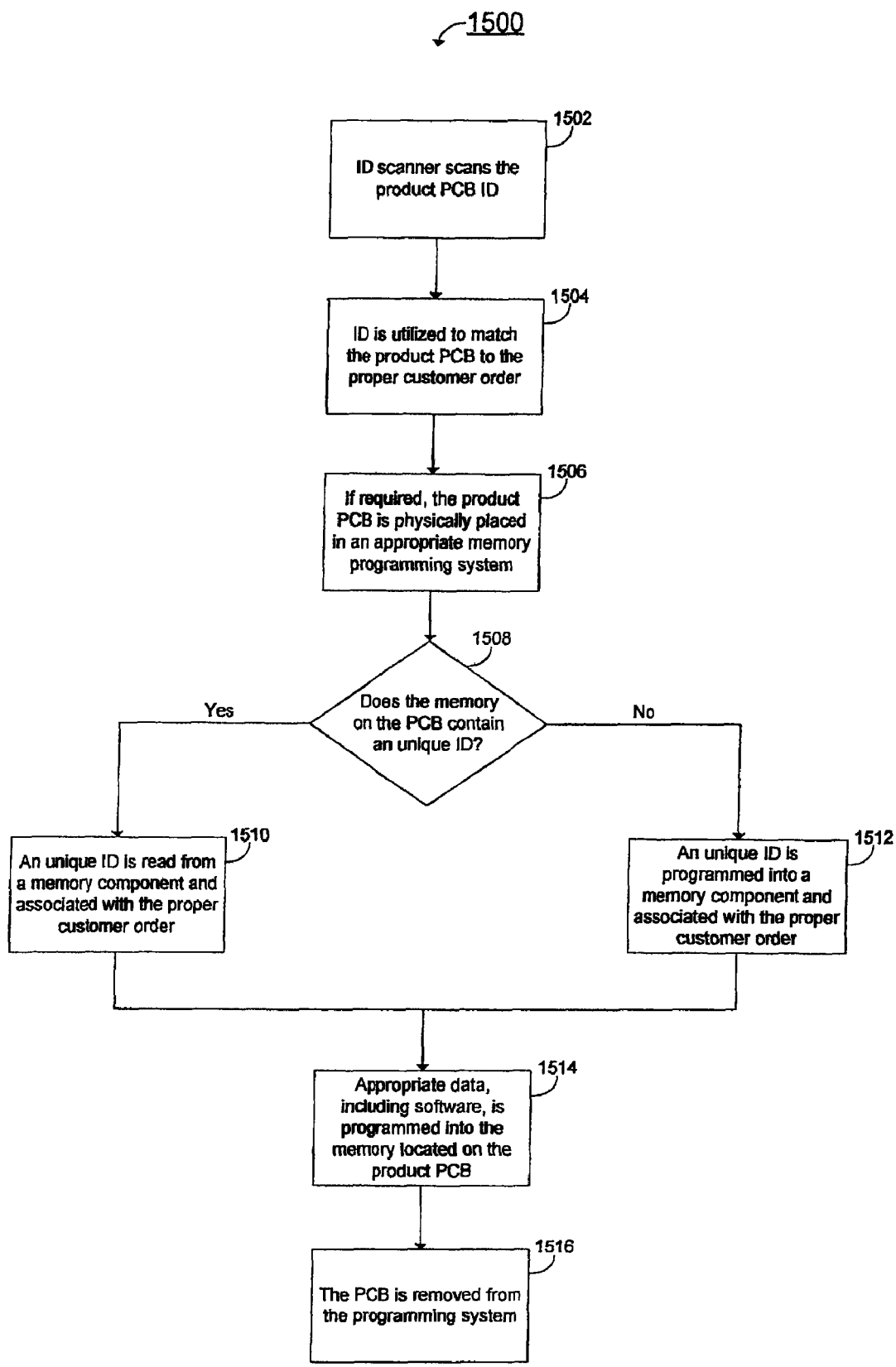
FIG. 15 shows a method for configuring a product.

FIG. 15 shows a method for configuring a product. During product configuration, a product's hardware and/or software, including firmware, are configured to meet the specifications of an order. Product configuration can include the programming of integrated circuits, such as programmable logic or memory devices, and other configuration steps that are generally known in the industry. For ease of exhibition, the product configuration process described includes only the programming of memory components of the product, and the system 600 can implement other aspects of product configuration. System 600 can use product configuration component 606 and a corresponding software module (i.e., one that provides the intelligence for product configuration) in performing method 1500.

A product PCB may be separated from the master PCB before entering a configuration process. Alternatively, the product PCB can be configured while still attached to the master PCB. The memory on the product PCB can be programmed using a gang programmer, which is a device that allows multiple boards to be programmed at the same time. Sufficient gang platform slots can be used to ensure that the time required to program memory does not bottleneck the manufacturing line. As discussed above, an externally accessible UID can take the form of a UID stored in a memory component located on the product PCB. The UID stored in the memory component can be accessible even after the electronic device has been completely assembled.

Alternative approaches can be implemented to program a product's memory. One can, for example, utilize newer wireless programming technologies to program any memory integrated circuits on the product PCB boards. The latter approach can be done concurrently with certain other manufacturing and shipping steps.

As shown in FIG. 15, system 600 can read the UID of the product PCB (step 1502). The UID is used to ensure that a known customer order is entering the memory station. Specifically, the UID is used to match the product PCB to the proper customer order (step 1504). If required, the product PCB is physically placed in an appropriate memory programming station (step 1506).

System 600 determines if an externally accessible UID exists in one or more of the memory components located on the PCB (step 1508). If such a UID already exists, then a unique ID is read from one of the memory components and associated with the proper customer order (step 1510). The UID can be stored in a data structure containing information regarding the customer order.

If a UID does not exist in one of the memory components, then a UID can be programmed into a memory component on the product PCB and the UID can be associated with the appropriate customer order (step 1512). The UID can be stored in a data structure containing information regarding the customer order.

One or more memory components located on the product PCB is programmed (step 1514) with the appropriate firmware, software, and data, which can be provided by a memory programming database. Step 1514 may involve system 600 sending an error message to the rework component 612. An error message would be sent if, for example, one or more memory components could not be properly programmed. Optionally, system 600 can execute one or more software algorithms to test one or more functions of the populated design on the product PCB while the board is still located in the memory programming system.

After the programming has been completed, the product PCB is removed from the programming system 600 (step 1516).

Figure 16:
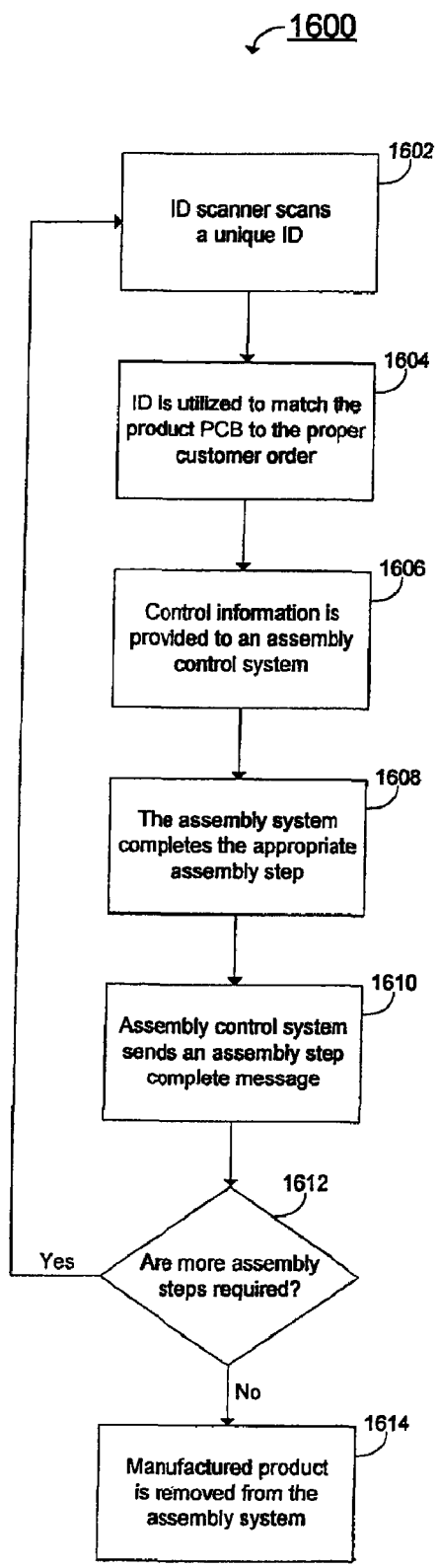
FIG. 16 shows a method for assembling a product.

FIG. 16 shows a method for assembling a product. System 600 can use product assembly component 608 and a corresponding software module (i.e., one that provides the intelligence for product assembly) in performing method 1600. System 600 can read the UID associated with the product PCB (step 1602). The UID is used to match the product PCB to the proper customer order (step 1604). When an assembly station is available and ready to assemble parts, system 600 provides the appropriate assembly control information to the assembly station's controller (step 1606). System 600 provides information to the assembly station's controller based upon the requirements for the specific order. The controller causes the assembly station to complete all of the appropriate assembly steps (step 1608) and then send an assembly step complete message (step 1610).

System 600 determines if more assembly steps are required to complete the product (step 1612). Depending upon the customer order being processed, there may be more assembly stations to which system 600 would need to route the partially assembled product. If the electronic device requires more assembly steps, then the device is routed to the next assembly station. In such a situation, the described product assembly method 1600 is repeated until no more assembly steps are required. When the product has been completely assembled, the product is forwarded to the next step in the manufacturing line (step 1614).

Figure 17:
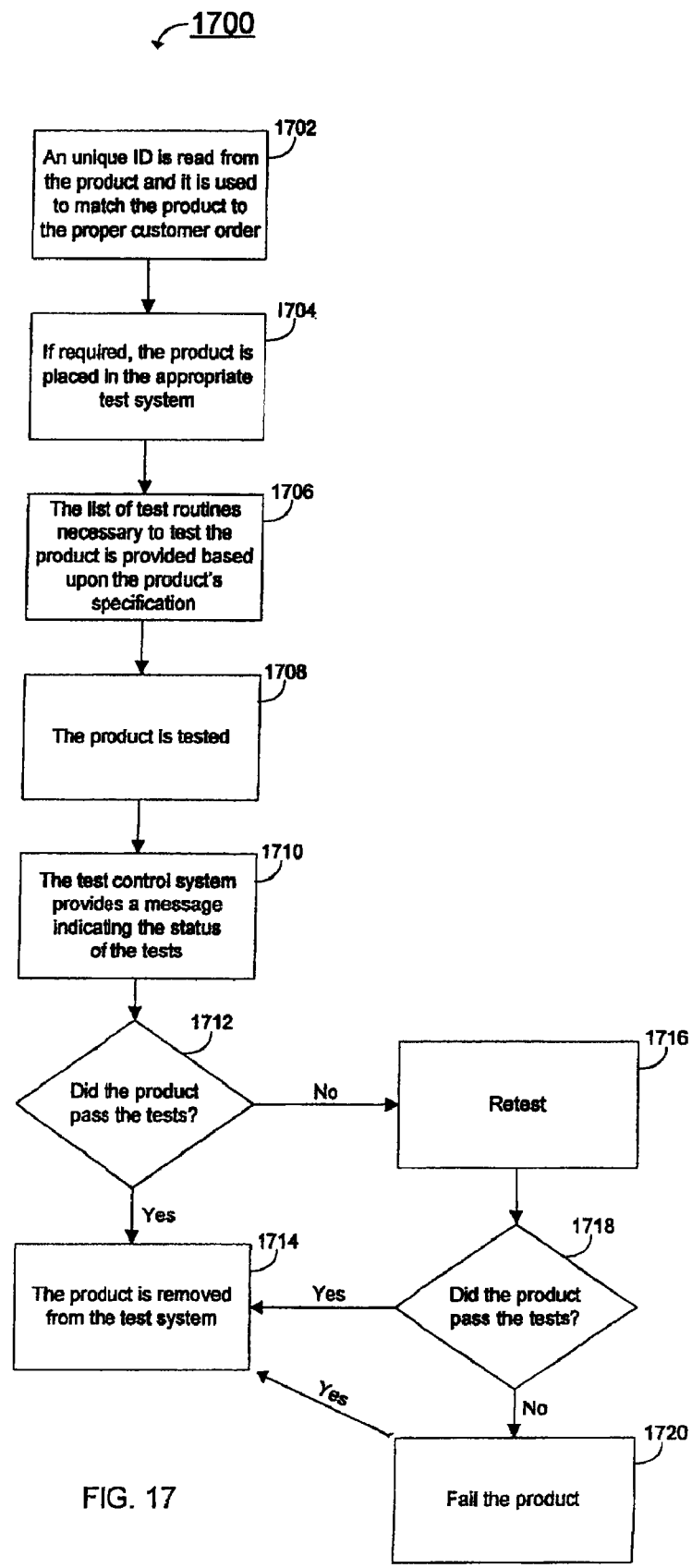
FIG. 17 shows a method for testing a product.

FIG. 17 shows a method 1700 for testing a product. System 600 can use test component 610 and a corresponding software module (i.e., one that provides the intelligence for product testing) in performing method 1700. System 600 can read the UID associated with the product PCB and uses the UID to match the product PCB to the proper customer order (step 1702). If required, the product PCB is physically placed in an appropriate test station (step 1704). The list of test routines needed to test the product is provided to the test station (step 1706). The list of test routines provided depends on the product specification. The list can be provided as an array data structure that includes information regarding each of test routines required to fully test the product based upon the product's specification. The data structure can include the starting memory addresses of each test routine. The test routines can reside in a database. The test station uses the appropriate test routines to test the product (step 1708). After completion of the test routines, the test station sends a test process finished signal and either a device functionality verified signal or, if the product fails any of the tests, an error message (step 1710). System 600 determines whether the product passes all the tests (step 1712). If the product did, then the product is removed from the tests station (step 1714). If the product did not pass the tests, as indicated by the presence of an error signal, system 600 can optionally cause the test component 610 to retest the product for a pre-determined number of times (step 1716). System 600 determines if the product passes the retests (step 1718). If the device subsequently passed the necessary tests during the number of pre-determined times, then system 600 may proceed to step 1714. Otherwise, system 600 fails the product (step 1720), then system 600 may proceed to step 1714. Note that system 600 can send an error message to rework component 612 to fulfill the order.

Figure 18:
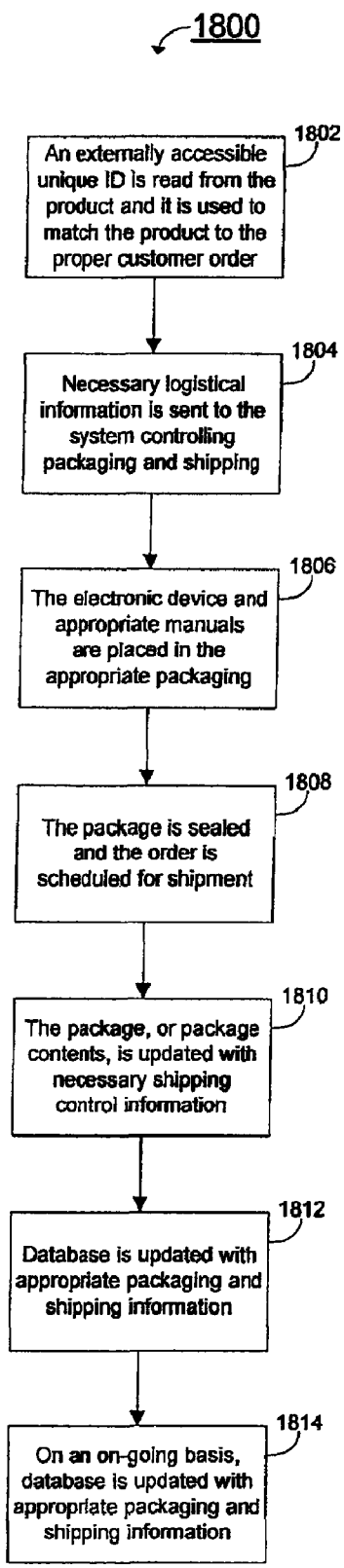
FIG. 18 shows a method for packaging and shipping a product.

FIG. 18 shows a method 1800 for packaging and shipping a product. System 600 can use packaging and shipping component 614 and a corresponding software module (i.e., one that provides the intelligence for packaging and shipping) in performing method 1800. In the described implementation, packaging and shipping are controlled and performed by the same module and components. Alternatively, these functions can be controlled and performed by separate modules and system components.

System 600 can reads a UID of the product to be shipped. System 600 uses the UID to match the product to the proper customer order (step 1802). If required, the product is physically placed at the appropriate packaging and shipping station. The customer order associated with the product includes the required shipping and packaging information, which are provide to a controller of the packaging and shipping station when the station is ready (step 1804). The information sent to the packaging and shipping station is tailored to needs of the particular customer order associated with the product. The packaging and shipping station can then process the customer order for shipment, for example, by placing the product and the appropriate manuals in the appropriate packaging (step 1806). The station seals the package and system 600 schedules the package for shipment (step 1808). System 600 can update the package or package contents with any updated shipping control information (step 1810). System 600 updates its databases with the appropriate inventory and shipping control information (step 1812). Updates the package or package contents with the updated shipping control information can include applying a label to the package with the appropriate delivery and tracking information. Updates can be also be effected by using wireless technology, for example, wireless Ethernet or RFID. On an on-going basis, system 600 can be updated with new shipping information, including any new delivery and tracking details, whenever relevant shipping details regarding a specific customer order are available (step 1814), which may occur, for example, when the customer order is shipped from a manufacturing location or distribution center.

In one implementation, system 600 can implement a method for generating a file of manufacturing instructions for one product by modifying a file of manufacturing instructions for another product. The products use a same product PCB layout. In general, modification can be effected by implementing one or more database tables, for example, a modification table, a product table, and a position table. The modification table includes sets of objects that are need to be added or removed to convert between two different product designs that utilize the same product PCB layout. The product table includes any applicable local geographic location and rotational information for an object in a product design for one or more product PCB layouts. The position table includes sets of geographic reference coordinates for all product PCB locations on one or more master PCBs. The file modified can be any of the above-described ones.

Figure 19:
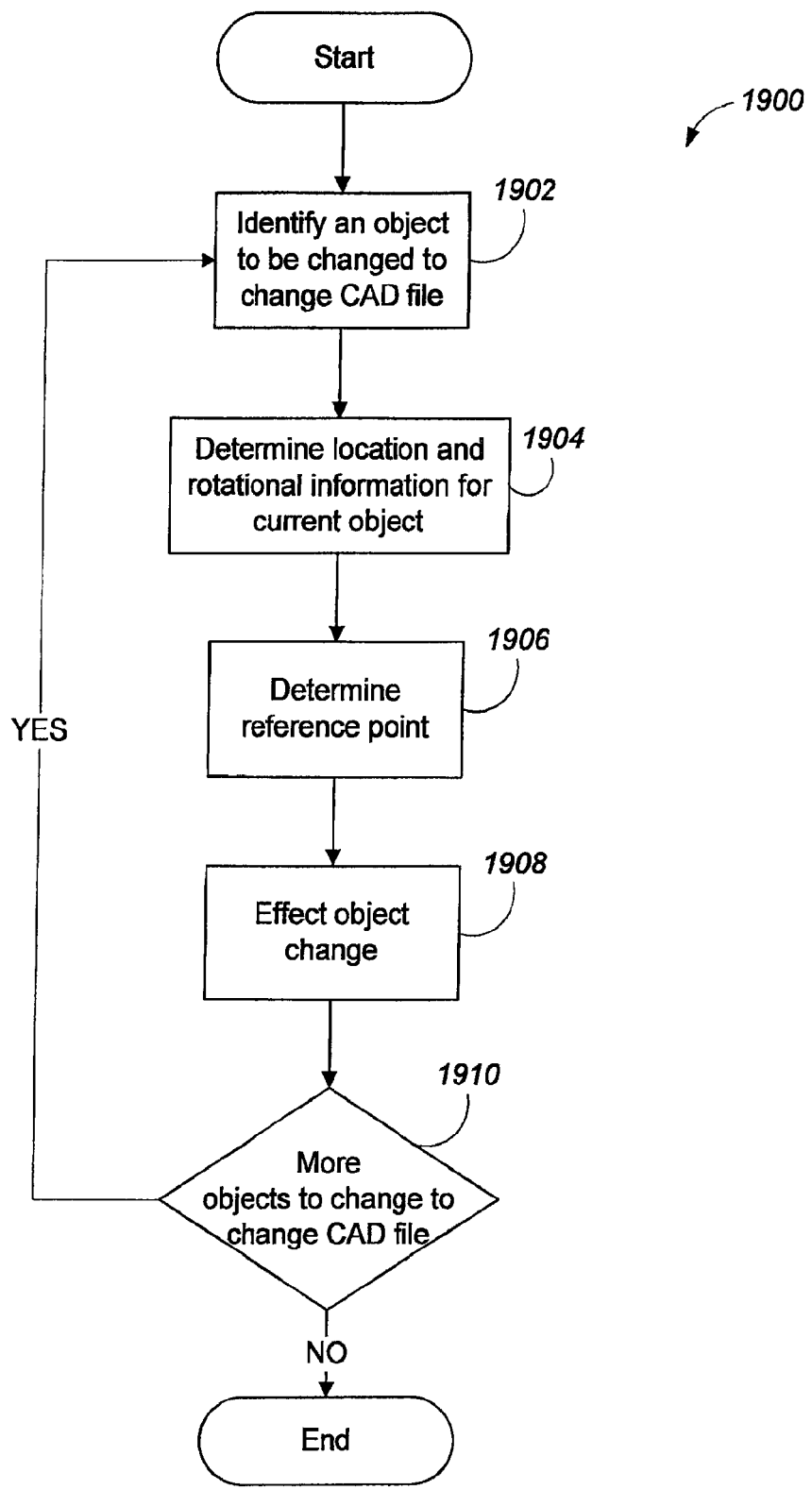
FIG. 19 shows a method for modifying an existing file of manufacturing instructions.
Figure 20:
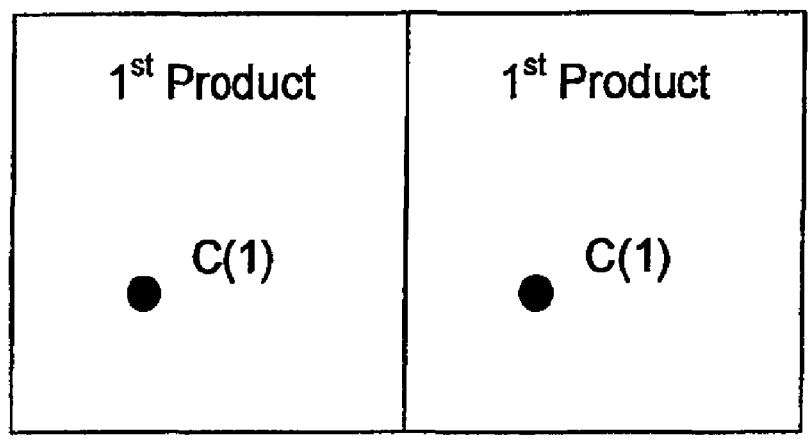
FIG. 20 illustrates an example of modifying an existing file of manufacturing instructions.
Figure 20:
Figure 20:
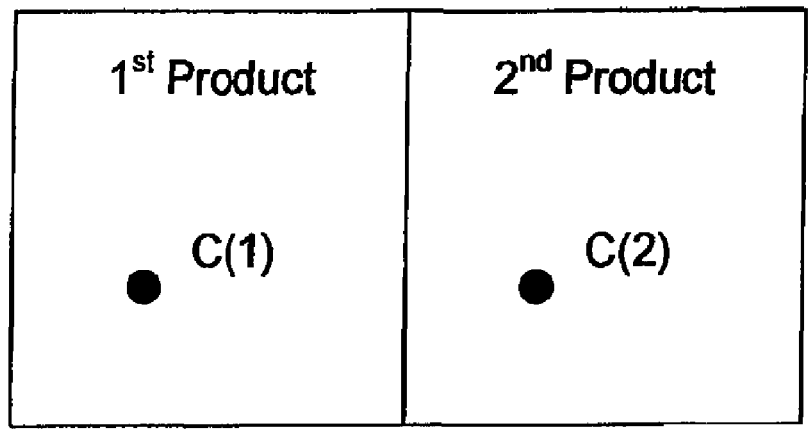

FIG. 19 shows an example of a method for modifying a first CAD design file for a master PCB layout A into a second CAD design file for a master PCB layout B. The master PCBs contain two product PCBs, which have identical layouts. Master PCB layout A has two product PCBs, each for a first product. Master PCB layout B has two product PCB, one for the first product and the other for a second product. As can be seen in FIG. 20, the modification changes the component to be populated in location (6,2,0) from a C(1) type component to a C(2) type component. The components both have a placement rotation of 0 degrees. As shown in FIG. 19, a system performing method 1900, for example, system 600, accesses a modification table to identify an object to be changed (step 1902). The system accesses a product table to determine location and rotational information for the current object (step 1904). In this case, the system determines that product A has component C(1) in local geographic location (2,2,0) for the applicable product PCB layout and that the component has a rotation of 0 degree. The system accesses a position table to determine a reference point from which the location and rotation information are based (step 1906). In this case, the reference point is (4,0,0). The vector (2,2,0) would, thus, be started from this reference point. For example, the system applies analytic geometry to add the local geographic location coordinates (2,2,0) to the reference coordinates (4,0,0) to provide the global geographic location coordinates C(1)=(6, 2,0). The system effects the required object change by removing the information related to C(1) from and adding the information related to C(2) to the first CAD file (step 1908). The system determines if there are more objects to be change to convert the first file (step 1910). If there are more objects to change, then the system repeats steps 1902-1908 as appropriate until there are no more objects to change. Otherwise, the system has completed the modification. The first file has been changed to the second file. Alternatively to the tables describes above, the information can be stored on fewer or more tables, including storing information in a single modification table.

The invention and all of the functional operations described in this specification can be implemented in digital electronic circuitry, or in computer software, firmware, or hardware, including the structural means disclosed in this specification and structural equivalents thereof, or in combinations of them. The invention can be implemented as one or more computer program products, i.e., one or more computer programs tangibly embodied in an information carrier, e.g., in a machine-readable storage device or in a propagated signal, for execution by, or to control the operation of, data processing apparatus, e.g., a programmable processor, a computer, or multiple computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question or in multiple coordinated files (e.g., files that store one or more modules, subprograms, or portions of code). A computer program can be deployed to be executed on one computer or on multiple computers at one site or distributed across multiple sites and interconnected by a communication network.

The processes and logic flows described herein, including the method steps of the invention, can be performed by one or more programmable processors executing one or more computer programs to perform functions of the invention by operating on input data and generating output. The processes and logic flows can also be performed by, and apparatus of the invention can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and memory for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

To provide for interaction with a user, the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The invention can be implemented in a computing system that includes a back-end component (e.g., a data server), a middleware component (e.g., an application server), or a front-end component (e.g., a client computer having a graphical user interface or a Web browser through which a user can interact with an implementation of the invention), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

The invention has been described in terms of particular embodiments, but other embodiments can be implemented and are within the scope of the following claims. For example, the operations of the invention can be performed in a different customer order and still achieve desirable results. In certain implementations, multitasking and parallel processing may be preferable. Other embodiments are within the scope of the following claims.

What is claimed is:

1. A method of manufacturing, the method comprising:
identifying components to be mounted on a printed circuit board of one or more products and generating information that specifies the components;
for each of the identified components, determining a location on the printed circuit board where the component is to be mounted by a component placement machine and generating information that specifies coordinates that indicate the location using a frame of reference independent of any master printed circuit board; and
associating the generated information with the one or more products,
wherein determining the location includes using information describing locations of components to be mounted on a master printed circuit board that includes the printed circuit board of the one or more products.

2. The method of claim 1, wherein identifying components to be mounted on the printed circuit board of the one or more products includes:
identifying components to be mounted on the printed circuit board of the one or more products, including using information describing components to be mounted on a master printed circuit board that includes the printed circuit board of the one or more products.

3. The method of claim 1, wherein determining locations of components to be mounted on the master printed circuit board includes:
converting coordinates of components to be mounted on the master printed circuit board from a coordinate system having a frame of reference that is relative to the master printed circuit board to a coordinate system having a frame of reference that is relative to the printed circuit board of the one or more products.

4. The method of claim 1, wherein using information describing locations of components to be mounted on the master printed circuit board includes:
using information of one of a CAD file for the master printed circuit board, a Gerber file, and a component placement file.

5. The method of claim 1, wherein determining the location of the component to be mounted on the printed circuit board includes:
determining an orientation of the component that is needed for mounting the component to the printed circuit board.

6. The method of claim 1, wherein associating the generated information with the one or more products includes storing the generated information in a product file for the one or more products.

7. A method of manufacturing, the method comprising:
identifying components to be mounted on a printed circuit board of a first product and generating information that specifies the components;
for each of the identified components of the first product, determining a location on the printed circuit board where the component is to be mounted by a component placement machine and generating information that specifies coordinates that indicate the location using a frame of reference independent of any master printed circuit board; and
associating the generated information with the first product, wherein the identifying components to be mounted on a printed circuit board is performed on the first product, the method further comprising:

identifying components to be mounted on a printed circuit board of a second product of the one or more products and generating information that specifies the components;

for each of the components identified as to be mounted on the printed circuit board of the second product, determining a location on the printed circuit board of the second product where the component is to be mounted and generating information that specifies coordinates that indicate the location using a frame of reference independent of any master printed circuit board;

associating the generated information with the second product; and in response to receiving a customer order specifying a combination of the first and second products, automatically using the generated information for the first product and the second product to design a placement layout for a master printed circuit board that includes a combination of printed circuit boards of the first and the second products, a placement layout of the master printed circuit board being a spatial arrangement of locations, on the master printed circuit board, where components are to be placed and a mounting configuration for each location, the designing being based on the combination specified by the customer order.

8. The method of claim 7, wherein:

the printed circuit board of the first product has a placement layout, a layout of the printed circuit board for the first product being a spatial arrangement of locations, on the printed circuit board for the first product, where electronic components are to be mounted and a mounting configuration of each location; and identifying components to be mounted on a printed circuit board of the second product includes identifying components to be mounted on a printed circuit board of a second product that has a same placement layout as the printed circuit board of the first product.

9. A computer program product, tangibly embodied in a non-transitory computer readable medium, for generating a product file, the computer program product being operable to cause a processor to:

identify components to be mounted on a printed circuit board of one or more products and generate information that specifies the components;

for each of the identified components, determine the location on the printed circuit board where the component is to be mounted by a component placement machine and generate coordinates that indicate the location using a frame of reference independent of any master printed circuit board; and associate the generated information with the one or more products, wherein determining the location includes using information describing locations of components to be mounted on a master printed circuit board that includes the printed circuit board of the one or more products.

10. A system for generating product files, the system comprising:

means for identifying components to be mounted on a printed circuit board of one or more products and generating information that specifies the components;

means for determining, for each of the components, the location on the printed circuit board where the component is to be mounted by a component placement machine and generating coordinates that indicate the location using a frame of reference independent of any master printed circuit board; and means for associating the generated information with the one or more products, wherein determining the location includes using information describing locations of components to be mounted on a master printed circuit board that includes the printed circuit board of the one or more products.

11. A computer-implemented method for manufacturing, the method comprising:

receiving one or more product files for a first product, the one or more product files including information that specifies a placement layout of a printed circuit board of the first product, the placement layout of the printed circuit board being a spatial arrangement of locations on the printed circuit board where electronic components are to be mounted by a placement machine and a mounting configuration of each location, the one or more product files further including information that specifies a component configuration of the printed circuit board, the component configuration of the printed circuit board indicating a type of component to be mounted for each location indicated in the layout information of the printed circuit board;

receiving one or more product files for a second product, the one or more product files for the second product including information that specifies a placement layout and a component configuration of a printed circuit board of the second product; and using any combination of the one or more product files for the first product and the one or more product files for the second product to generate an analysis board file, the analysis board file including information that specifies a placement layout of a master printed circuit board that includes any combination of the printed circuit boards for the first and the second product, each printed circuit board having the placement layout and component configuration specified by the corresponding product file, wherein determining a configuration for the component placement machine is based on the analysis board file.

12. The method of claim 11, wherein the component placement machine is part of a manufacturing line that includes at least another component placement machine, the method further comprising:

determining a configuration for the at least another component placement machine.

13. The method of claim 12, wherein determining configuration includes:

determining which component placement machine mounts which types of components specified in the product files.

14. The method of claim 12, wherein:

the component placements machines each include one or more feeders; and determining configuration includes determining which types of components to load into which feeder.

15. The method of claim 11, wherein there are at least two or more feeders for the component placement machine, the method further comprising:

determining which types of components specified in the one or more product files for the first product and the one or more product files for the second product to load into which feeders of the component placement machine, the determining being based on the analysis board file.

16. The method of claim 11, wherein:

the product files specify a same placement layout.

17. A method for generating workload files, the method comprising:
- receiving one or more product files for a first product, the one or more product files including information that specifies a placement layout of a printed circuit board of the first product, a placement layout of a printed circuit board being a spatial arrangement of locations on the printed circuit board where electronic components are to be mounted by a placement machine and a mounting configuration of each location, the one or more product files further including information that specifies a component configuration of the printed circuit board, a component configuration of a printed circuit board indicating a type of component to be mounted for each location indicated in the layout information of the printed circuit board;
- using the one or more product files for the first product to generate an analysis board file for the first product, the analysis board file including information that describes a placement layout of a first master printed circuit board that includes one or more printed circuit boards each having the placement layout and component configuration specified by the one or more product files for the first product; and
- determining a configuration for a component placement machine, the determining being based on the analysis board file for the first product;
- prior to receiving an order, generating a workload file, the workload file including all information needed for a particular gantry on such component placement machine to populate, at least partially, a printed circuit board of the first product; and
- storing the workload files for subsequent use.

18. A computer-implemented method for manufacturing, the method comprising:
- receiving the workload files for a first product, each work load file including all information needed for a particular gantry of a component placement machine to populate, at least partially, a printed circuit board of the first product;
- receiving the workload files for a second product, each work load file including all information needed for a particular gantry of a component placement machine to populate, at least partially, a printed circuit board of the second product; and
- in response to receiving a customer order for a particular combination of the first and second products, using the workload files of the first and second products to generate a production file that includes instructions for using the manufacturing line to produce the particular combination of the first and second products.

19. A computer program product, tangibly stored on a non-transitory computer machine readable medium, for manufacturing, the product comprising instructions to cause a processor to:
- receive one or more product files for a first product, the one or more product files including information that specifies a placement layout of a printed circuit board of the first product, a placement layout of a printed board being a spatial arrangement of locations on the printed circuit board where electronic components are to be mounted by a placement machine and a mounting configuration of each location, the one or more product files further including information that specifies a component configuration of the printed circuit board, a component configuration of a printed circuit board indicating a type of component to be mounted for each location indicated in the layout information of the printed circuit board;
- receive one or more product files for a second product, the one or more product files for the second product including information that specifies a placement layout and a component configuration of a printed circuit board of the second product; and
- use any combination of the one or more product files for the first product and the one or more product files for the second product to generate an analysis board file, the analysis board file including information that specifies a placement layout of a master printed circuit board that includes any combination of the printed circuit boards for the first product and the second product, each printed circuit board having the placement layout and component configuration specified by the corresponding product file; and
- determine a configuration for the component placement machine based on the analysis board file.

20. A system for manufacturing, comprising:
- means for receiving one or more product files for a first product, the one or more product files including information that specifies a placement layout of a printed circuit board of the first product, a placement layout of a printed board being a spatial arrangement of locations on the printed circuit board where electronic components are to be mounted by a placement machine and a mounting configuration of each location, the one or more product files further including information that specifies a component configuration of the printed circuit board, a component configuration of a printed circuit board indicating a type of component to be mounted for each location indicated in the placement layout information of the printed circuit board;
- means for receiving one or more product files for a second product, the one or more product files for the second product including information that specifies a placement layout and a component configuration of a printed circuit board of the second product; and
- means for using any combination of the one or more product files for the first product and the one or more product files for the second product to generate an analysis board file, the analysis board file including information that specifies a placement layout of a master printed circuit board that includes any combination of the printed circuit boards for the first product and the second product, each printed circuit board having the placement layout and component configuration specified by the corresponding product file,
- wherein determining a configuration for the component placement machine is also based on the analysis board file.

21. A method for manufacturing, comprising:
- receiving one or more product files for a first product, the one or more product files for the first product including information that specifies a placement layout of a printed circuit board of the first product, a placement layout of a printed circuit board being a spatial arrangement of locations on the printed circuit board where electronic components are to be mounted by a placement machine and a mounting configuration of each location, the one or more product files further including information that specifies a component configuration of the printed circuit board, a component configuration of a printed circuit board indicating a type of component to be mounted for each location indicated in the placement layout information of the printed circuit board;

receiving one or more product files for a second product;

in response to receiving an customer order specifying a combination of the first and the second products, using the one or more product files for the first product and second products to automatically design a single placement layout for a single master printed circuit board that includes printed circuit boards for the first and the second products, the designing being based on the combination specified by the customer order.

22. The method of claim 21, wherein the first product is configurable, the method further comprising:

receiving a customer order for one or more first products, the customer order specifying a configuration for each of the one or more first products;

populating the master printed circuit board; and prior to separating a master printed circuit board that includes printed circuit boards for the one or more first products specified by the customer order, configuring the printed circuit boards for the one or more first products according to the customer order.

23. The method of claim 22, further comprising:

prior to separating a master printed circuit board that includes printed circuit boards for the one or more first product specified by the customer order, performing one or more tests on the configured products.

24. The method of claim 21, further comprising:

determining that the master printed circuit board is not available from stock; and requesting fabrication of the master printed circuit board.

25. The method of claim 21, wherein:

the master printed circuit board is a previously fabricated master printed circuit board and the layout of the printed circuit board of the first product has been pre-determined.

26. The method of claim 21, further comprising:

storing, in a virtual master printed circuit board file, information describing the master printed circuit board that includes printed circuit boards for the first and the second products.

27. The method of claim 21, further comprising:

using information in the virtual master printed circuit board file and an optimization process to configure a component placement machine.

28. The method of claim 21, wherein the first and second products are configurable and the customer order specifies their configuration, the method further comprising:

populating the master printed circuit board; and prior to separating the master printed circuit board, configuring the printed circuit boards in accordance with the customer order.

29. The method of claim 28, further comprising:

prior to separating the master printed circuit board, performing one or more tests one the configured printed circuit boards.

30. The method of claim 21, wherein:

the master printed circuit board includes one or more embedded passive components having a spatial arrangement that is compatible with the layout of the printed circuit board of the first product.

31. A computer-implemented method of manufacturing:

determining, for a printed circuit board for a first product, which placement mechanism of a manufacturing line that include one or more placement mechanisms will place which components of the first product;

for each placement mechanism, generating instructions operable to cause the placement mechanism to place the components determined to be placed by the placement mechanism, and associate the instructions with the placement mechanism, storing the generated instructions in a first workload file that is associated with the first product, the first workload file being accessible to a controller of the manufacturing line;

determining, for a printed circuit board for a second product, which placement mechanism of the manufacturing line will place which components of the second product;

for each placement mechanism, generating instructions operable to cause the placement mechanism to place the components determined to be placed by the placement mechanism, and associate the instructions with the placement mechanism;

storing the generated instructions in a second workload file that is associated with the second product, the second workload file being accessible to the controller of the manufacturing line; and in response to receiving a customer order specifying a particular combination of the first and second products, using the first and second workload files to generate a production file, the production file including instructions for the manufacturing line to produce the particular combination of the first and second products.

32. The method of claim 31, further comprising:

identifying components of the first product.

33. A computer-implemented method of manufacturing, comprising:

identifying differences, if any exists, between a component configuration of a printed circuit board of a first product and a component configuration of a printed circuit board of a second product;

identifying differences, if any exits, between a placement layout of the printed circuit board of the first product and the placement layout of the printed circuit board of the second product;

storing information specifying any differences identified; and in response to receiving a customer order for a particular combination of the first and second products, automatically using the stored information to modify a file that includes placement machine manufacturing instructions for the first product into a file that includes placement machine manufacturing instructions for the first and second products.

34. The method of claim 33, wherein:

storing information specifying any difference identified includes storing the information in one or more database tables.

35. The method of claim 33, wherein:

each product has a product file and a platform file; and modifying includes modifying based on information of the product files and platform files of the products.

36. The method of claim 33, wherein:

the printed circuit board of the first product and the printed circuit board for the second product have a same layout.

37. A method comprising:

identifying one or more components in a layout of a printed circuit board of a first product;

for each component identified in the layout of the first product, determining a location of the component;

generating coordination information indicative of the location of the component using a frame of reference that is independent of any master printed circuit board; and associating the generated coordinate information with the first product identifying one or more components in a layout of a printed circuit board of a second product;

for each component identified in the layout of the second product, determining a location of the component;

generating coordination information indicative of the location of the component using a frame of reference that is independent of any master printed circuit board;

associating the generated coordinate information with the second product;

in response to receiving a customer order specifying a combination of the first and second products, automatically using the generated information for the first product and the second product to design a layout for a master printed circuit board that includes a combination of printed circuit boards of the first and the second products the designing being based on the combination specified by the customer order, a layout of the master printed circuit board being a spatial arrangement of locations, on the master printed circuit board, where components are located and a mounting configuration for each location, components in the layout including but not limited to a plurality of insulating materials, conducting materials, pads and vias.

38. The method of claim 37, wherein identifying the one or more components in the layout includes:

identifying each component in the layout including identifying each component associated with one or more layers of the printed circuit board.

39. The method of claim 37, wherein identifying the one or more components in the layout includes:

identifying the one or more components in a layout of a master printed circuit board that includes the printed circuit board of the product.

40. The method of claim 37, wherein determining the location of the component includes:

determining the coordinate information describing the location of the component in a layout of a master printed circuit board that includes the printed circuit board of the product.

41. The method of claim 40, wherein determining the coordinate information describing the location of the component in the layout of the master printed circuit board includes:

converting the coordination information in the layout of the master printed circuit board from a coordinate system having a frame of reference that is relative to the master printed circuit board to a coordinate system having a frame of reference that is relative to the printed circuit board of the product.

42. The method of claim 40, wherein determining the coordinate information describing the location of the component in the layout of the master printed circuit board includes:

extracting the coordinate information from one of a CAD file for the master printed circuit board and a Gerber file.

43. A method comprising:

receiving a product file for a first product, the product file for the first product including information that specifies a layout of a printed circuit board of the first product;

receiving a product file for a second product; and in response to receiving a request specifying a combination of the first product and the second product, designing a layout for a master printed circuit board that includes one or more printed circuit boards associated with the first product and the second product including the printed circuit board of the first product based on the product file for the first product and the product file for the second product, where designing the layout is performed based on the combination specified by the request.

44. The method of claim 43, further comprising:

storing, in a virtual master printed circuit board file, information describing the master printed circuit board that includes the one or more printed circuit boards associated with the first product and the second product including the printed circuit board of the first product.

45. A method comprising:

identifying one or more components in a layout of a printed circuit board of one or more products and generating information that specifies the components, a layout of a printed circuit board being a spatial arrangement of locations, on the printed circuit board, where components are located and a mounting configuration for each location, components in a layout of a printed circuit board including but not limited to a plurality of insulating materials, conducting materials, pads and vias;

for each component identified in the layout of the one or more products, determining a location of the component and generating information that specifies coordinates that indicate the location using a frame of reference independent of any master printed circuit board; and associating the generated coordinate information with the one or more products wherein determining the location includes using information describing locations of components to be mounted on a master printed circuit board that includes the printed circuit board of the one or more products.

* * * * *

UNITED STATES PATENT AND TRADEMARK OFFICE
CERTIFICATE OF CORRECTION

PATENT NO. : 8,145,341 B2  
APPLICATION NO. : 11/679798  
DATED : March 27, 2012  
INVENTOR(S) : Brian B. Jaroszewski et al.

Page 1 of 1

It is certified that error appears in the above-identified patent and that said Letters Patent is hereby corrected as shown below:

On the Title page: Item (56) References Cited:

Column 2, Other Publications, line 1, please delete "Generatin" and insert therefor --Generation--;

Column 2, Other Publications, line 1, please delete "Circiuit" and insert therefor --Circuit--;

Column 2, Other Publications, line 2, please delete "1994;;", and insert therefor --1994;--;

Column 2, Other Publications, line 4, please delete "Internaltion YSymposium" and insert therefor --International Symposium--;

In the Claims:

Column 23, line 60, Claim 19, after "printed", please insert --circuit--;

Column 24, line 25, Claim 20, after "printed", please insert --circuit--;

Column 25, line 5, Claim 21, please delete "products" and insert therefor --product--;

Column 25, line 54, Claim 29, please delete "one" and insert therefor --on--;

Column 26, line 36, Claim 33, please delete "exits" and insert therefor --exists--;

Column 26, line 59, Claim 36, please delete "for" and insert therefor --of--; and Column 27, line 2, Claim 37, after "product", please insert --;--.

Signed and Sealed this
Seventeenth Day of July, 2012

David J. Kappos
*Director of the United States Patent and Trademark Office*